US011031377B2

(12) United States Patent
Liu

(10) Patent No.: US 11,031,377 B2
(45) Date of Patent: Jun. 8, 2021

(54) INTEGRATION OF THREE-DIMENSIONAL NAND MEMORY DEVICES WITH MULTIPLE FUNCTIONAL CHIPS

(71) Applicant: Yangtze Memory Technologies Co., Ltd., Hubei (CN)

(72) Inventor: Jun Liu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/521,214

(22) Filed: Jul. 24, 2019

(65) Prior Publication Data
US 2020/0328186 A1 Oct. 15, 2020

Related U.S. Application Data

(63) Continuation of application No. PCT/CN2019/082607, filed on Apr. 15, 2019.

(51) Int. Cl.
*H01L 25/065* (2006.01)
*H01L 23/00* (2006.01)
(Continued)

(52) U.S. Cl.
CPC .......... *H01L 25/0657* (2013.01); *H01L 24/32* (2013.01); *H01L 24/83* (2013.01);
(Continued)

(58) Field of Classification Search
CPC . H01L 2224/80895; H01L 2224/81895; H01L 2224/83895; H01L 2224/83896; H01L 2251/0651; H01L 2251/0654
See application file for complete search history.

(56) References Cited

U.S. PATENT DOCUMENTS 9,000,599 B2 4/2015 Raorane et al.
10,163,864 B1 12/2018 England
(Continued)

FOREIGN PATENT DOCUMENTS

CN 101000880 A 7/2007
CN 104157631 A 11/2014
(Continued)

OTHER PUBLICATIONS

International Search Report and Written Opinion of the International Searching Authority directed to related International Patent Application No. PCT/CN2019/082607, dated Jan. 16, 2020; 8 pages.

*Primary Examiner* — Daniel P Shook
(74) *Attorney, Agent, or Firm* — Sterne, Kessler, Goldstein & Fox P.L.L.C.

(57) ABSTRACT

Embodiments of three-dimensional semiconductor devices and fabrication methods are disclosed. The method includes forming a first and a second memory chips and a microprocessor chip. The method also includes bonding a first interconnect layer of the first memory chip with a second interconnect layer of the second memory chip, such that one or more first memory cells of the first memory chip are electrically connected with one or more second memory cells of the second memory chip through interconnect structures of the first and second interconnect layers. The method further includes bonding a third interconnect layer of the microprocessor chip with a substrate of the second memory chip, such that the one or more microprocessor devices of the microprocessor chip are electrically connected with one or more second memory cell of the second memory chip through interconnect structures of the second and third interconnect layers.

20 Claims, 15 Drawing Sheets

(51) Int. Cl.
  *H01L 25/00* (2006.01)
  *H01L 27/108* (2006.01)
  *H01L 27/11* (2006.01)
  *H01L 27/115* (2017.01)

(52) U.S. Cl.
  CPC ............ *H01L 25/50* (2013.01); *H01L 27/108* (2013.01); *H01L 27/11* (2013.01); *H01L 27/115* (2013.01); *H01L 2224/32146* (2013.01); *H01L 2224/83895* (2013.01); *H01L 2224/83896* (2013.01); *H01L 2225/06541* (2013.01)

(56) References Cited

U.S. PATENT DOCUMENTS

| | | |
|---|---|---|
| 2008/0191312 A1 | 8/2008 | Oh et al. |
| 2018/0261623 A1 | 9/2018 | Higashi et al. |
| 2019/0006222 A1 | 1/2019 | Or-Bach et al. |
| 2019/0088581 A1* | 3/2019 | Yu ..................... H01L 24/81 |
| 2019/0109049 A1 | 4/2019 | Or-Bach et al. |

FOREIGN PATENT DOCUMENTS

| | | |
|---|---|---|
| CN | 105789139 A | 7/2016 |
| CN | 107887395 A | 4/2018 |
| CN | 108063097 A | 5/2018 |
| CN | 108288609 A | 7/2018 |
| CN | 109155301 A | 1/2019 |
| CN | 109411443 A | 3/2019 |
| WO | WO 2019/104896 A1 | 6/2019 |

* cited by examiner

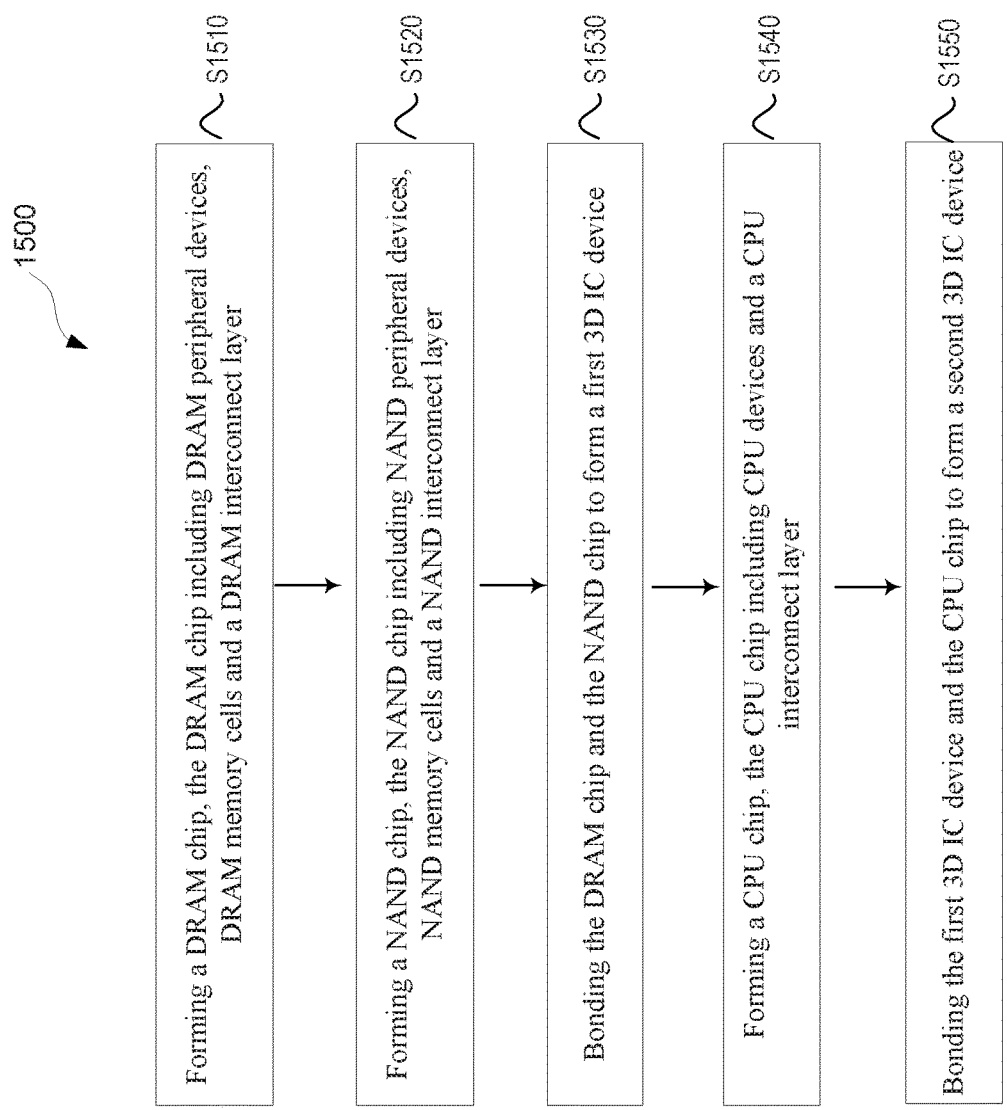

INTEGRATION OF THREE-DIMENSIONAL NAND MEMORY DEVICES WITH MULTIPLE FUNCTIONAL CHIPS

CROSS-REFERENCE TO RELATED APPLICATIONS AND INCORPORATION BY REFERENCE

This application claims priority to PCT/CN2019/082607 filed on Apr. 15, 2019, which is incorporated herein by reference in its entirety.

TECHNICAL FIELD

The present disclosure generally relates to the field of semiconductor technology, and more particularly, to a method for forming a three-dimensional (3D) integrated circuit.

BACKGROUND

Planar integrated circuit (IC) devices are scaled to smaller sizes by improving process technology, circuit designs, programming algorithms, and the fabrication process. However, as feature sizes of the logic/analog devices and memory cells approach a lower limit, planar process and fabrication techniques become challenging and costly. As such, density and bandwidth for planar IC devices approach an upper limit. A three-dimensional (3D) IC architecture can address the density and performance limitation in planar IC device.

BRIEF SUMMARY

Embodiments of a three-dimensional integrated circuit device and methods for forming the same are described in the present disclosure.

One aspect of the present disclosure provides a method for forming a three-dimensional semiconductor device including forming a microprocessor chip, which includes forming at least one microprocessor device on a first substrate and forming a first interconnect layer on the at least one microprocessor device, the first interconnect layer having at least one first interconnect structure. The method also includes forming a memory chip, which includes forming at least one memory cell on a second substrate and forming a second interconnect layer on the at least one memory cell, the second interconnect layer having at least one second interconnect structure. The method further includes bonding the first interconnect layer of the microprocessor chip with the second interconnect layer of the memory chip, such that the at least one microprocessor device of the microprocessor chip is electrically connected with the at least one memory cell of the memory chip through the at least one first interconnect structure or the at least one second interconnect structure.

In some embodiments, the bonding of the first interconnect layer of the microprocessor chip with the second interconnect layer of the memory chip includes dielectric-to-dielectric bonding and metal-to-metal bonding at a bonding interface.

In some embodiments, the forming of the microprocessor chip includes forming a digital signal processor, a microcontroller, or a central computing unit for a computer or a mobile device.

In some embodiments, the forming of the memory chip includes forming a static random-access memory, a dynamic random-access memory or a flash memory.

Another aspect of the present disclosure provides a method for forming a three-dimensional semiconductor device including forming a first memory chip, which includes forming at least one first memory cell on a first substrate and forming a first interconnect layer on the at least one first memory cell, the first interconnect layer having at least one first interconnect structure. The method also includes forming a second memory chip, which includes forming at least one second memory cell on a second substrate and forming a second interconnect layer on the at least one second memory cell, the second interconnect layer having at least one second interconnect structure. The method further includes bonding the first interconnect layer of the first memory chip with the second interconnect layer of the second memory chip, such that the at least one first memory cell of the first memory chip is electrically connected with the at least one second memory cell of the second memory chip through the at least one first interconnect structure or the at least one second interconnect structure. The method also includes forming a microprocessor chip, which includes forming at least one microprocessor device on a third substrate and forming a third interconnect layer on the at least one microprocessor device, the third interconnect layer having at least one third interconnect structure. The method further includes bonding the third interconnect layer of the microprocessor chip with the first substrate of the first memory chip, such that the at least one microprocessor device of the microprocessor chip is electrically connected with the at least one first memory cell of the first memory chip through the at least one first interconnect structure or the at least one third interconnect structure.

In some embodiments, the bonding of the first interconnect layer of the first memory chip with the second interconnect layer of the second memory chip includes dielectric-to-dielectric bonding and metal-to-metal bonding at a bonding interface.

In some embodiments, the bonding of the third interconnect layer of the microprocessor chip with the first substrate of the first memory chip includes dielectric-to-dielectric bonding and metal-to-metal bonding at a bonding interface.

In some embodiments, the method for forming a three-dimensional semiconductor device further includes forming at least one vertical interconnect structure, extending through the first substrate of the first memory chip, where the at least one vertical interconnect structure provides electrical connection to the at least one first interconnect structure.

In some embodiments, the method for forming a three-dimensional semiconductor device also includes forming at least one vertical interconnect structure, extending through the second substrate of the second memory chip, where the at least one vertical interconnect structure provides electrical connection to the at least one second interconnect structure.

In some embodiments, the method for forming a three-dimensional semiconductor device further includes forming at least one input/output pad electrically connected with the at least one vertical interconnect structure of the second memory chip.

In some embodiments, the method for forming a three-dimensional semiconductor device also includes forming at least one vertical interconnect structure, extending through the third substrate of the microprocessor chip, where the at least one vertical interconnect structure provides electrical connection to the at least one third interconnect structure.

In some embodiments, the method for forming a three-dimensional semiconductor device further includes forming at least one input/output pad electrically connected with the at least one vertical interconnect structure of the microprocessor chip.

In some embodiments, the method for forming a three-dimensional semiconductor device further includes thinning the first or the second substrate after the bonding of the first interconnect layer of the first memory chip with the second interconnect layer of the second memory chip, where the thinning comprises grinding, wet or dry etching, or chemical-mechanical polishing.

In some embodiments, the method for forming a three-dimensional semiconductor device further includes thinning the second or the third substrate after the bonding of the third interconnect layer of the microprocessor chip with the first substrate of the first memory chip, where the thinning comprises grinding, wet or dry etching, or chemical-mechanical polishing.

In some embodiments, the forming of the microprocessor chip includes forming a digital signal processor, a microcontroller, or a central computing unit for a computer or a mobile device.

In some embodiments, the forming of the first memory chip includes forming a static random-access memory or a dynamic random-access memory.

In some embodiments, the forming of the second memory chip includes forming a flash memory.

Another aspect of the present disclosure provides a three-dimensional (3D) semiconductor device having a microprocessor chip which includes at least one microprocessor device on a first substrate and a first interconnect layer disposed on the at least one microprocessor device, the first interconnect layer including at least one first interconnect structure. The 3D semiconductor device also includes a memory chip, having at least one memory cell on a second substrate and a second interconnect layer disposed on the at least one memory cell, the second interconnect layer including at least one second interconnect structure. In the 3D semiconductor device, the first interconnect layer of the microprocessor chip is bonded with the second interconnect layer of the memory chip, and the at least one microprocessor device is electrically connected with the at least one memory cell through the at least one first interconnect structure or the at least one second interconnect structure.

In some embodiments, the three-dimensional semiconductor device further includes a bonding interface between the first interconnect layer of the microprocessor chip and the second interconnect layer of the memory chip, where the bonding interface comprises dielectric-to-dielectric bonding and metal-to-metal bonding.

In some embodiments, the microprocessor chip includes a digital signal processor, a microcontroller, or a central computing unit for a computer or a mobile device.

In some embodiments, the memory chip includes a static random-access memory, a dynamic random-access memory or a flash memory.

Another aspect of the present disclosure provides a three-dimensional (3D) semiconductor device having a microprocessor chip which includes at least one microprocessor device on a first substrate and a first interconnect layer disposed on the at least one microprocessor device, the first interconnect layer including at least one first interconnect structure. The 3D semiconductor device also includes a first memory chip, having at least one first memory cell on a second substrate and a second interconnect layer disposed on the at least one first memory cell, the second interconnect layer including at least one second interconnect structure. The 3D semiconductor device further includes a second memory chip, having at least one second memory cell on a third substrate and a third interconnect layer disposed on the at least one second memory cell, the third interconnect layer including at least one third interconnect structure. In the 3D semiconductor device, the first interconnect layer of the microprocessor chip is bonded with the second substrate of the first memory chip, and the at least one microprocessor device of the microprocessor chip is electrically connected with the at least one first memory cell of the first memory chip through the at least one first interconnect structure or the at least one second interconnect structure. In the 3D semiconductor device, the third interconnect layer of the second memory chip is also bonded with the second interconnect layer of the first memory chip, and the at least one microprocessor device of the microprocessor chip is electrically connected with the at least one second memory cell of the second memory chip through the at least one first interconnect structure, the at least second interconnect structure, or the at least one third interconnect structure.

In some embodiments, in the three-dimensional semiconductor device, the at least one first memory cell of the first memory chip is electrically connected with the at least one second memory cell of the second memory chip through the at least one third interconnect structure or the at least one second interconnect structure.

In some embodiments, the three-dimensional semiconductor device further includes at least one vertical interconnect structure, extending through the first, the second or the third substrate, where the at least one vertical interconnect structure provides electrical connection to the at least one first interconnect structure, the at least one second interconnect structure or the at least one third interconnect structure.

In some embodiments, the three-dimensional semiconductor device also includes at least one input/output pad on the first or third substrate, electrically connected with the at least one vertical interconnect structure.

In some embodiments, the three-dimensional semiconductor device further includes a bonding interface between the third interconnect layer of the second memory chip and the second interconnect layer of the first memory chip, where the bonding interface includes dielectric-to-dielectric bonding and metal-to-metal bonding.

In some embodiments, the three-dimensional semiconductor device also includes a bonding interface between the first interconnect layer of the microprocessor chip and the second substrate of the first memory chip, where the bonding interface includes dielectric-to-dielectric bonding and metal-to-metal bonding.

In some embodiments, the microprocessor chip includes a digital signal processor, a microcontroller, or a central computing unit for a computer or a mobile device.

In some embodiments, the first memory chip includes a static random-access memory or a dynamic random-access memory.

In some embodiments, the second memory chip includes a flash memory.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 15 illustrates a flow diagram of an exemplary method for forming a 3D IC device with a NAND chip, a DRAM chip and a CPU chip, according to some embodiments of the present disclosure.

Figure 1:
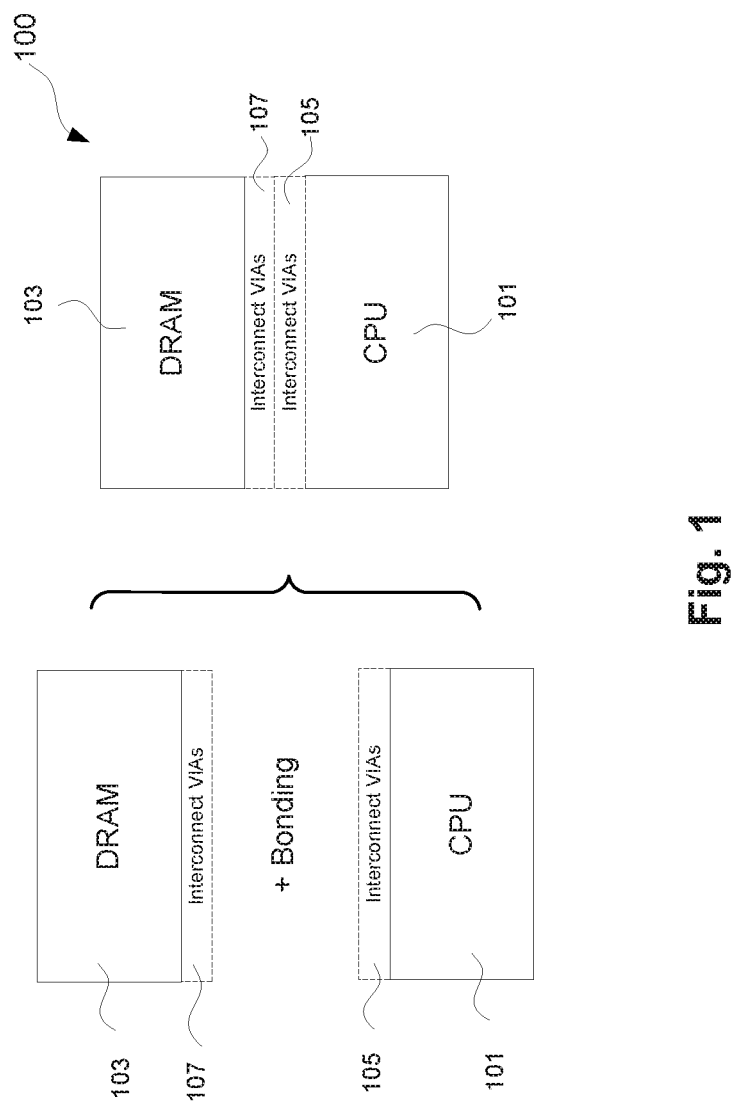
FIG. 1 illustrates a schematic of an exemplary three-dimensional (3D) integrated circuit (IC) device, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical" or "vertically" means nominally perpendicular to the lateral surface of a substrate.

As technology development for integrated circuits (ICs) approaching fundamental limitations in semiconductor device performance, three-dimensional (3D) ICs, which contain multiple stacked layers of active devices and circuits, offer an attractive alternative to traditional two-dimensional (2D) planar ICs. 3D ICs can provide many benefits including high density, high band-width, low-power, and small form-factor. One possible application is stacking a single or multiple memory chips on top of a logic chip, where the logic chip and the memory chip can communicate through hundreds of interconnects, e.g., inputs/outputs (IOs), allowing high-bandwidth with low power consumption. By optimizing the architecture and floor-planning, interconnection lengths between the memory chip and the logic chip can be minimized, resulting in reduced delay and improved bandwidth.

Through-Silicon-Via (TSV) has been used as a solution in building 3D ICs. It is a technology where vertical interconnects are formed through the (silicon) substrate to enable communication among the stacked chips. Although silicon substrate can be thinned down, certain thickness is required to maintain mechanical strength and provide support to the multi-stacked 3D ICs. Due to the thickness of the silicon substrate and challenges in high aspect ratio VIA etching and metal filling, TSV has large lateral dimensions and pitch, limiting the number of TSVs that can be used and thereby limiting performance improvement of the 3D ICs.

Various embodiments in accordance with the present disclosure provide fabricating methods and corresponding 3D IC devices with smaller size, higher density, higher bandwidth and improved performance (speed/power) compared with other 3D ICs. By using hybrid bonding technology, dynamic random-access memory (DRAM), NAND flash memory or other functional chips can be integrated with a central processing unit (CPU) chip through thousands or millions of metal interconnects, enabling a super chip, e.g., a computer-on-a-chip.

An example of a first embodiment of the present disclosure will now be described with reference to FIGS. 1 to 6.

FIG. 1 illustrates a schematic view of an exemplary 3D IC device 100 according to some embodiments of the present disclosure. 3D IC device 100 can include a microprocessor chip 101 and a memory chip 103. In some embodiments, the microprocessor chip 101 can be any suitable microprocessor, for example, a digital signal processor, a microcontroller, or a central computing unit (CPU) for a computer or a mobile device. In some embodiments, the memory chip 103 can be any suitable volatile or non-volatile memory, for example, a static random-access memory (SRAM), a dynamic random-access memory (DRAM), a phase change memory, a magnetic random-access memory or a flash memory. As an example, the microprocessor chip 101 can be a CPU chip and is also referred to as the CPU chip 101, and the memory chip 103 can be a DRAM chip and is also referred to as the DRAM chip 103. The CPU chip 101 and the DRAM chip 103 can include a plurality of CPU interconnect VIAs 105 and DRAM interconnect VIAs 107, respectively. Through hybrid bonding, the DRAM chip 103 and the CPU 101 can be joined together to form the 3D IC device 100. The DRAM chip 103 and the CPU chip 101 can be electrically connected together through the CPU/DRAM interconnect VIAs 105/107.

Figure 2:
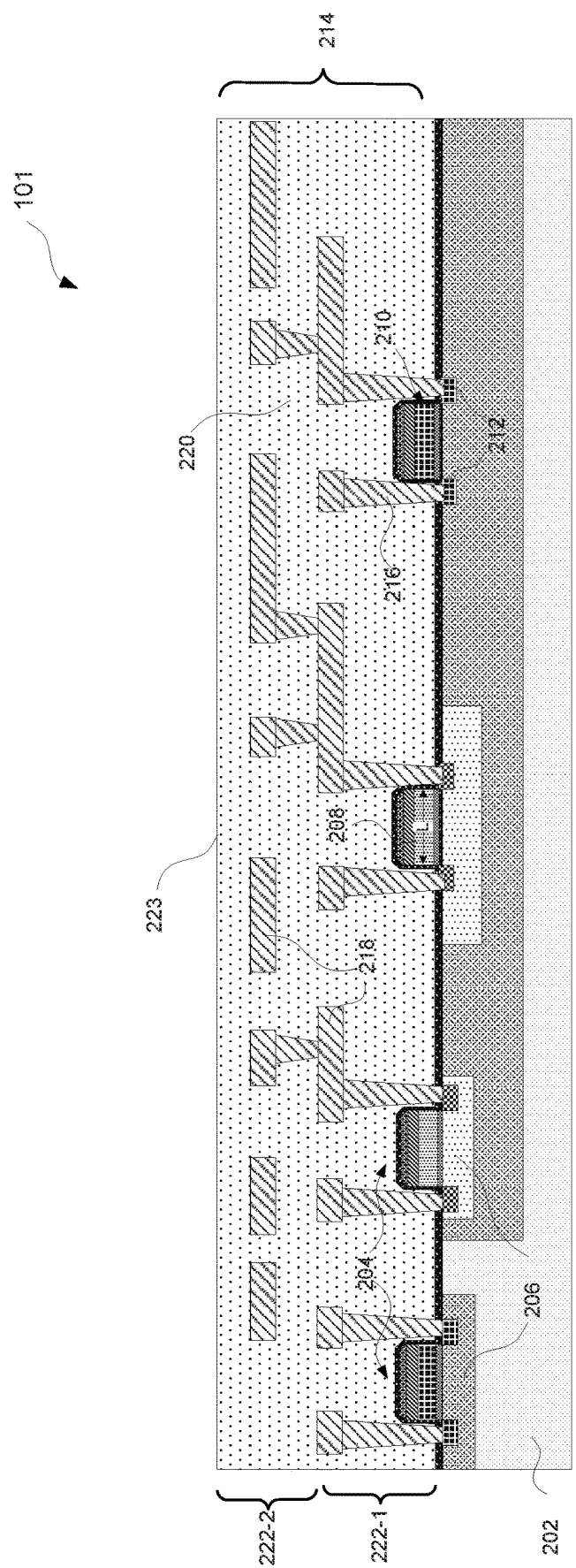
FIG. 2-3 illustrate schematic cross-sectional views of a CPU chip at various process stages, according to some embodiments of the present disclosure.

FIG. 2 illustrates a cross-section of an exemplary CPU chip 101 according to some embodiments of the present disclosure. The CPU chip 101 can include a CPU substrate 202, which can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof.

The CPU chip 101 can include one or more microprocessor device or CPU device 204 on the CPU substrate 202. The CPU device can be formed "on" the CPU substrate 202, in which the entirety or part of the CPU device 204 is formed in the CPU substrate 202 (e.g., below the top surface of the CPU substrate 202) and/or directly on the CPU substrate 202. The CPU device 204 can include any suitable semiconductor devices, for example, metal oxide semiconductor field effect transistors (MOSFETs), bipolar junction transistors (BJTs), diodes, resistors, capacitors, inductors, etc. Among the semiconductor devices, p-type and/or n-type MOSFETs are widely implemented in logic circuit design, and are used as examples for the CPU device 204 in the present disclosure.

A CPU device 204 can be either a p-channel MOSFET or an n-channel MOSFET and can include, but not limited to, an active device region surrounded by shallow trench isolation (STI) (not shown in FIG. 2), a well 206 formed in the active device region with n-type or p-type doping, a gate stack 208 that includes a gate dielectric, a gate conductor and/or a gate hard mask. The CPU device 204 can also include a source/drain extension and/or halo region (not shown in FIG. 2), a gate spacer 210 and a source/drain 212 locating on each side of the gate stack. The CPU device 204 can further include a silicide contact area (not shown) in the top portion of the source/drain. Other known devices can be also formed on the CPU substrate 202. The structure and fabrication method of the CPU device 204, are known to those skilled in the art, and are incorporated herein for entirety.

The STI can be formed through patterning the substrate using lithography and etching, filling an insulating material and polishing the insulating material to form a coplanar surface on the substrate 202. An insulating material for STI can include silicon oxide, silicon oxynitride, TEOS, low-temperature oxide (LTO), high temperature oxide (HTO), silicon nitride, etc. An insulating material for STI can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI can also include a high temperature annealing step to densify the disposed insulating material for better electrical isolation. Other STI structures can be employed, as would be apparent to a person of ordinary skill in the art.

The well 206 of the CPU device 204 can include a p-type doping for n-channel MOSFET and an n-type doping for p-channel MOSFET, and is called p-well and n-well, respectively. The dopant profile and concentration of the well 206 affects the device characteristics of the CPU device 204. For MOSFET devices with low threshold voltage ($V_t$), the well 206 can be doped with lower concentration, and can form low-voltage p-well or low-voltage n-well. For MOSFET with high $V_t$, the well 206 can be doped with higher concentration, and can form high-voltage p-well or high-voltage n-well. In some embodiments, to provide electrical isolation from p-type substrate 202, a deep n-well can be formed underneath a high-voltage p-well for an n-channel MOSFET with high $V_t$.

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 208 of the CPU device 204 can be formed by a "gate first" scheme, where the gate stack 208 is disposed and patterned prior to source/drain formation. The gate stack 208 of the CPU device 204 can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, or combinations thereof.

In some embodiments, the gate conductor can be made from a metal, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

The gate spacer 210 can be formed through disposing an insulating material and then performing anisotropic etching. The insulating material for the gate spacer 210 can be any insulator, including silicon oxide, silicon nitride, silicon oxyntiride, TEOS, LTO, HTO, etc. The gate spacer 210 can be disposed using techniques such as CVD, PVD, PECVD, LPCVD, RTCVD, MOCVD, ALD, sputtering, or combinations thereof. The anisotropic etching of the gate spacer 210 includes dry etching, for example reactive ion etching (ME).

A length L of the gate stack 208 between the source/drain 212 is an important feature of the MOSFET. The gate length L determines the magnitude of drive current of a MOSFET and is therefore scaled down aggressively for logic circuits. The gate length L can be less than about 100 nm. In some embodiments, the gate length can be in a range between about 5 nm to about 30 nm. Patterning of the gate stack with such a small dimension is very challenging, and can use techniques including optical proximity correction, double exposure and/or double etching, self-aligned double patterning, etc.

In some embodiments, the source/drain 212 of the CPU device 204 is incorporated with high concentration dopants. For n-type MOSFETs, the dopant for source/drain 212 can include any suitable n-type dopant, such as phosphorus, arsenic, antimony, etc., and/or any combination thereof. For p-type MOSFETs, the dopant for source/drain 212 can include any suitable p-type dopant, for example boron. The dopant incorporation can be achieved through ion implantation followed by dopant activation anneal. The source/drain 212 can be made of the same material as the substrate 202, for example, silicon. In some embodiments, the source/drain 212 of a CPU device 204 can be made of a different material from the substrate 202 to achieve high performance. For example, on a silicon substrate, the source/drain 212 for a p-type MOSFETs can include SiGe and the source/drain 212 for an n-type MOSFETs can include carbon incorporation. The forming of the source/drain 212 with a different material can include etching back the substrate material in the source/drain area and disposing new source/drain material using techniques such as epitaxy. Doping for source/drain 212 can also be achieved through in-situ doping during epitaxy.

The CPU device 204 can also have an optional source/drain extension and/or halo region (not shown in FIG. 2) along each side of the gate stack 208. The source/drain extension and/or halo region locates inside the active device region below the gate stack, and is implemented mainly for better short channel control for the CPU device 204 with a channel length less than about 0.5 µm. The forming of the source/drain extension and/or halo region can be similar to the forming of the source/drain 212, but may use different implantation conditions (e.g., dose, angle, energy, species, etc.) to obtain optimized doping profile, depth or concentration.

The CPU device 204 can be formed on the CPU substrate 202 with a planar active device region (as shown in FIG. 2), where the direction of MOSFET's channel and current flow is parallel to the top surface of the CPU substrate 202. In some embodiments, the CPU device can also be formed on the CPU substrates 202 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

The CPU device 204, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some embodiments, the CPU device 204 other than MOSFET can also be fabricated with additional design and/or lithography mask levels to achieve specific circuit requirements.

In some embodiments, a plurality of the CPU devices 204 can be used to form any digital, analog, and/or mixed-signal circuits for the operation of the CPU chip 101. The CPU chip 101 can perform, for example, the basic arithmetic, logic, controlling, and input/output (I/O) operations specified by instructions.

In some embodiments, the CPU chip 101 can include a CPU interconnect layer 214 above the CPU devices 204 to provide electrical connections between different CPU devices 204 and external devices (e.g., power supply, another chip, I/O device, etc.). The CPU interconnect layer 214 can include one or more interconnect structures, for example, one or more vertical contact structures 216 and one or more lateral conductive lines 218. The contact structure 216 and conductive line 218 can broadly include any suitable types of interconnects, such as middle-of-line (MOL) interconnects and back-end-of-line (BEOL) interconnects. The contact structure 216 and conductive line 218 in the CPU chip 101 can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides (WSi$_x$, CoSi$_x$, NiSi$_x$, AlSi$_x$, etc.), or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

CPU interconnect layer 214 can further include an insulating layer 220. The insulating layer 220 in the CPU interconnect layer 214 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof.

In FIG. 2, two conductive levels 222 (also referred to as "metal levels") are illustrated as an example, where each metal level 222 include the contact structures 216 and the conductive lines 218 with the conductive lines 218 of the same metal level located at the same distance from the CPU substrate 202. The number of metal levels 222 for the CPU chip 101 is not limited and can be any number optimized for the CPU performance.

The CPU interconnect layer 214 can be formed by stacking metal levels 222 from bottom to the top of the CPU chip 101. In the example of the CPU chip 101 in FIG. 2, the bottom metal level 222-1 can be formed first and then the upper metal level 222-2 can be formed on top of the bottom metal level 222-1. Fabrication processes of each metal level 222 can include, but not limited to, disposing a portion of the insulating layer 220 with a thickness required for the metal level, patterning the portion of the insulating layer 220 using photo lithography and dry/wet etching to form contact holes for the contact structures 216 and the conductive lines 218, disposing conductive materials to fill the contact holes for the contact structures 216 and the conductive lines 218, and removing excess conductive materials outside the contact holes by using planarization process such as chemical mechanical polishing (CMP) or reactive ion etching (RIE).

In some embodiments, the topmost conductive lines 218 are coplanar with the top surface 223 of the CPU chip 101, where the topmost conductive lines 218 can be directly connected to the conductive lines on another chip or an external device.

In some embodiments, the topmost conductive lines 218 are embedded inside the insulating layer 220, where the insulating material on top of the conductive lines 218 provide scratch protection during shipping or handling. Electrical connections to the topmost conductive lines 218 can be established later by forming metal VIAs, or simply by etching back the insulating layer 220 using dry/wet etching.

Figure 3:
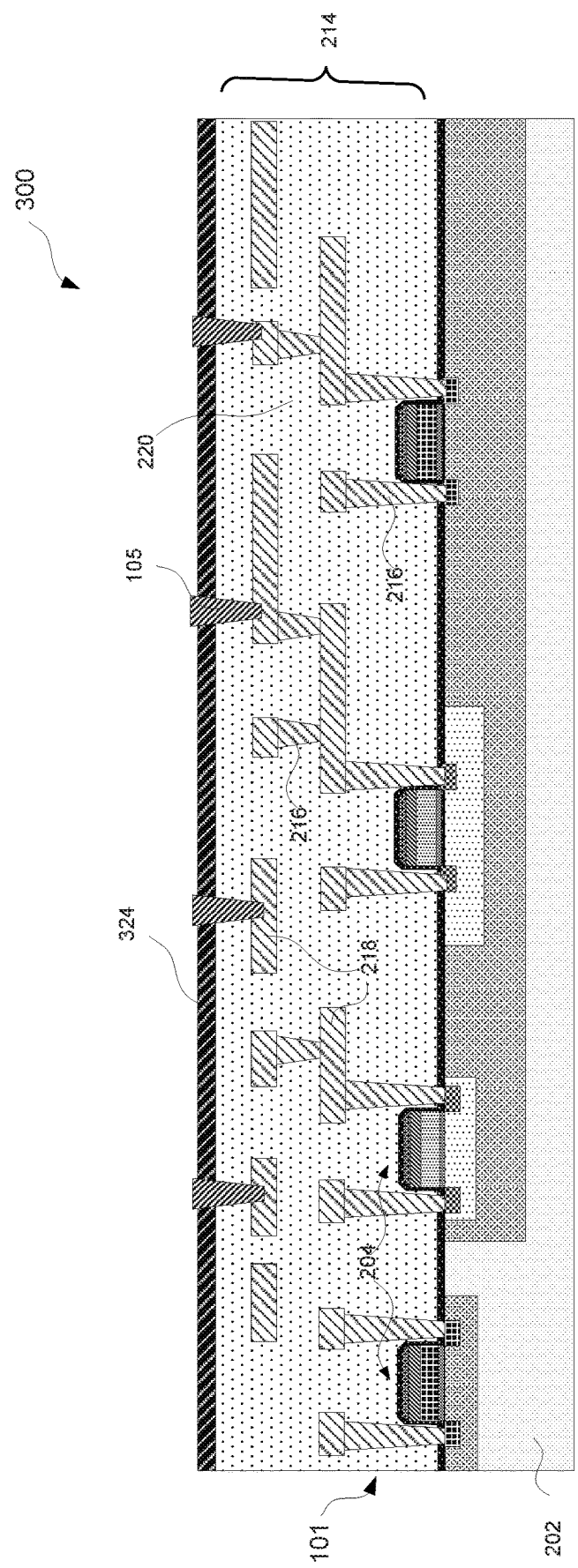

FIG. 3 illustrates a cross-section of an exemplary CPU chip 300 at certain process stage, according to some embodiments of the present disclosure. The CPU chip 300 includes a bonding layer 324 disposed on top of the CPU chip 101. The CPU chip 300 also includes a plurality of CPU interconnect VIAs 105, where the CPU interconnect VIAs 105 extend through the bonding layer 324 into the insulating layer 220 and form electrical contacts with the conductive lines 218 of the CPU chip 101.

The bonding layer 324 can include dielectric materials such as silicon oxide, silicon nitride, silicon oxynitride or any combination thereof. The bonding layer 324 can also include adhesion materials, for example, epoxy resin, polyimide, dry film, photosensitive polymer, etc. The bonding layer 324 can be formed by one or more thin film deposition processes such as CVD, PVD, PECVD, ALD, high-density-plasma CVD (HDP-CVD), sputtering, spin-coating, or any combination thereof.

The CPU interconnect VIA 105 can include metal such as copper (Cu), tin (Sn), nickel (Ni), gold (Au), silver (Ag), titanium (Ti), aluminum (Al), titanium nitride (TiN), tantalum nitride (TaN), etc., or any combination thereof. The metal of CPU interconnect VIA 105 can be disposed by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

The fabrication process of the CPU interconnect VIA 105 can further include, but not limited to, photolithography, wet/dry etching, planarization (e.g., CMP, or RIE etchback), etc.

Figure 4A:
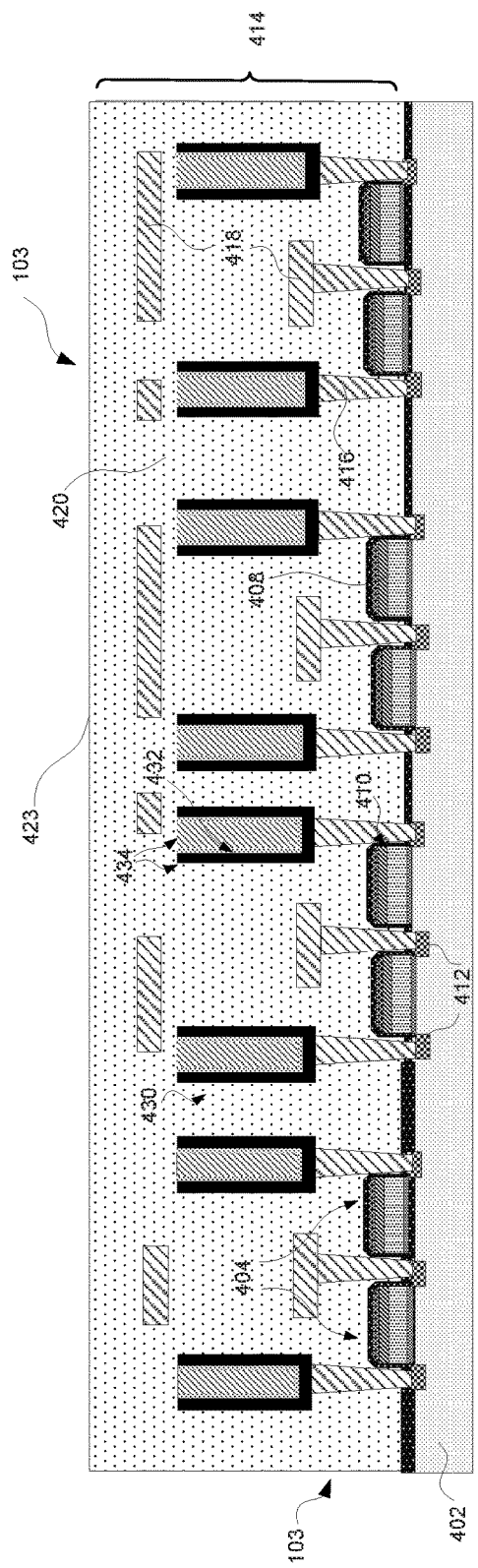
FIGS. 4A and 4B illustrate schematic cross-sectional views of a DRAM chip at various process stages, according to some embodiments of the present disclosure.

FIG. 4A illustrates a cross-section of an exemplary DRAM chip 103, according to some embodiments of the present disclosure. The DRAM chip 103 includes a DRAM substrate 402, DRAM peripheral devices (not shown), DRAM memory cells and a DRAM interconnect layer 414. The DRAM substrate 402 can be similar to the CPU substrate 202. The DRAM interconnect layer 414 can be similar to the CPU interconnect layer 214 and can be formed using similar materials and similar processes. For example, interconnect structures (such as contact structure 416 and conductive line 418) and insulating layer 420 of the DRAM interconnect layer 414 are similar to the interconnect structures (such as contact structure 216 and conductive line 218) and insulating layer 220 of the CPU interconnect layer 214, respectively.

In some embodiments, the DRAM peripheral device can include any active and/or passive semiconductor devices, such as transistors, diodes, capacitors, resistors, etc. A plurality of DRAM peripheral devices can form suitable digital, analog, and/or mixed-signal peripheral circuits to support the operation of the DRAM chip 103. For example, the peripheral circuit can include a page buffer, a decoder (e.g., a row decoder and a column decoder), a sense amplifier, a driver, a charge pump, timing and controls, and the like circuitry. The DRAM peripheral device can be similar to the CPU device 204 and can be formed using similar processes.

A plurality of DRAM memory cells can be arranged as a DRAM memory array, the core region of the DRAM chip that provides storage functions. Each DRAM memory cell include a DRAM device 404 and a DRAM capacitor 430. The DRAM device 404 can be similar to the CPU device 204 and can also include any suitable semiconductor devices, for example, metal oxide semiconductor field effect transistors (MOSFETs). N-type MOSFETs are often implemented in DRAM memory cells as access transistors. In FIG. 4 MOSFETs are illustrated as an example of the DRAM devices 404.

Similar to the CPU device 204, the DRAM device 404 can also include, but not limited to, an active device region surrounded by shallow trench isolation (STI), a well formed in the active device region with n-type or p-type doping, a gate stack 408 that includes a gate dielectric, a gate conductor and/or a gate hard mask. The DRAM device 404 can also include a source/drain extension and/or halo region, a gate spacer 410 and a source/drain 412 locating on each side of the gate stack. The CPU device 204 can further include a silicide contact area in the top portion of the source/drain. For simplicity, the STI, well, extension/halo, and silicide contact area of the DRAM device 404 are not shown in FIG. 4. Other known devices can be also formed on the DRAM substrate 402. The structure and fabrication method of the DRAM device 204 can be similar to the CPU device 204 with modifications (e.g., dimension, thickness, dopant/concentration, etc.) for different device performance.

The DRAM device 404 can be formed on the DRAM substrate 402 with a planar active device region (as shown in FIG. 4), where the direction of MOSFET's channel and current flow is parallel to the top surface of the DRAM substrate 402. In some embodiments, the DRAM device 404 can also be formed on the DRAM substrates 402 with a 3D active device region, for example a vertical MOSFET or gate-all-around MOSFET, where the gate stack of the MOSFET is wrapped around a silicon pillar and the current flow direction is perpendicular to the DRAM substrate 402. The structure and methods for the vertical MOSFET and gate-all-around MOSFET device are known to those skilled in the art and are not discussed further in present disclosure.

In some embodiments, the DRAM capacitor 430 of the DRAM chip 103 can include a capacitor dielectric layer 432 sandwiched between two capacitor electrodes 434. The capacitor dielectric layer 432 can include any suitable dielectric material, for example, silicon oxide, silicon nitride, silicon oxynitride, or any combination thereof. The capacitor dielectric layer 432 can also include high-k dielectric materials, for example, hafnium oxide, zirconium oxide, aluminum oxide, tantalum oxide, lanthanum oxide, or any combination thereof. The capacitor dielectric layer 432 can be disposed by any suitable methods such as thermal oxidation, CVD, PVD, PECVD, LPCVD, sputtering, MOCVD, ALD, or any combination thereof. The capacitor electrode 434 can include any suitable conductive material, for example, a metal or metallic compound such as tungsten (W), aluminum (Al), copper (Cu), cobalt (Co), titanium (Ti), tantalum (Ta), titanium nitride (TiN), tantalum nitride (TaN), and/or any combination thereof. The metal or metallic compound can be disposed using a suitable deposition method such as CVD, PVD, PECVD, sputtering, thermal evaporation, e-beam evaporation, MOCVD, and/or ALD.

In some embodiments, the topmost conductive lines 418 are coplanar with the top surface 423 of the DRAM chip 103, where the topmost conductive lines 418 can be directly connected to the conductive lines on another chip or an external device.

In some embodiments, the topmost conductive lines 418 are embedded inside the insulating layer 420, where the insulating material on top of the conductive lines 418 provides scratch protection during shipping or handling. Electrical connections to the topmost conductive lines 418 can be established later by forming metal VIAs, or simply by etching back the insulating layer 420 using dry/wet etching.

Figure 4B:
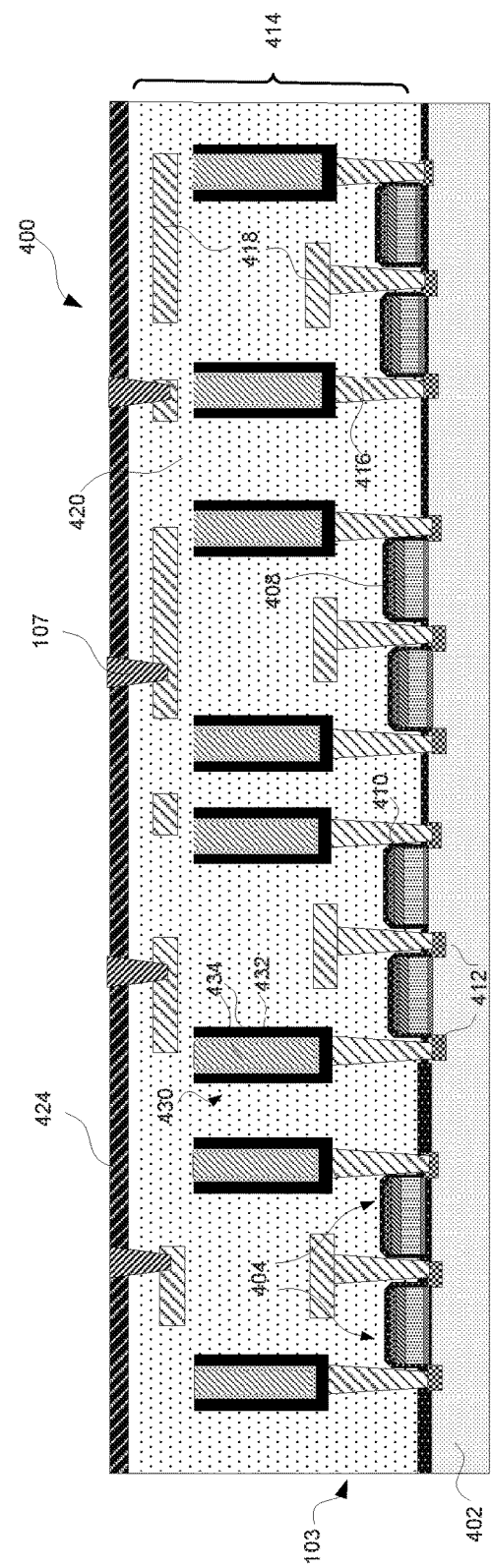

FIG. 4B illustrates a cross-section of an exemplary DRAM chip 400 at certain process stage, according to some embodiments of the present disclosure. The DRAM chip 400 includes the DRAM chip 103, a bonding layer 424 disposed on the DRAM chip 103, and a plurality of DRAM interconnect VIAs 107 formed for the DRAM chip 103. The structure and fabrication method for the DRAM bonding layer 424 and interconnect VIAs 107 are similar to the CPU bonding layer 324 and interconnect VIAs 105, respectively.

DRAM chip 103 stores each bit of data in the DRAM capacitor 430 that can be charged or discharged. A DRAM memory cell usually include one DRAM capacitor 430 and one DRAM device 404 (e.g. access transistor using n-type MOSFET). DRAM's memory cells are usually arranged in a rectangular array, where the word lines are connected to the gate electrodes of the DRAM devices 404 and the bit lines are connected to the drains of the DRAM devices 404.

As a volatile memory, DRAM periodically rewrite the bit of data to maintain the storage bit in the DRAM capacitor 430. However, compared to four or six transistors in a static random access memory (SRAM) cell, the DRAM memory cell is much simpler and smaller. This allows DRAM to reach very high densities, making DRAM much cheaper per bit. Therefore, DRAM is widely used in digital electronics where low-cost and high-capacity memory is required. One of the largest applications for DRAM is the main memory in microprocessors (e.g., CPU and GPU).

Traditionally a DRAM chip is wire-bonded to a CPU chip during packaging. Stacking DRAM chip on top of a CPU chip (or vice versa) becomes increasingly difficult as the number of I/O in the chips increase. Through-silicon-via (TSV) has the potential to offer larger interconnect density. However TSV is relative large compared to the conventional BEOL Cu VIAs. In addition, as the contact pitch getting smaller and smaller, underfill becomes extremely challenging post bonding.

According to some embodiments of the present disclosure, the DRAM chip 103 can be bonded to the CPU chip 101 using hybrid bonding technique.

Figure 5:
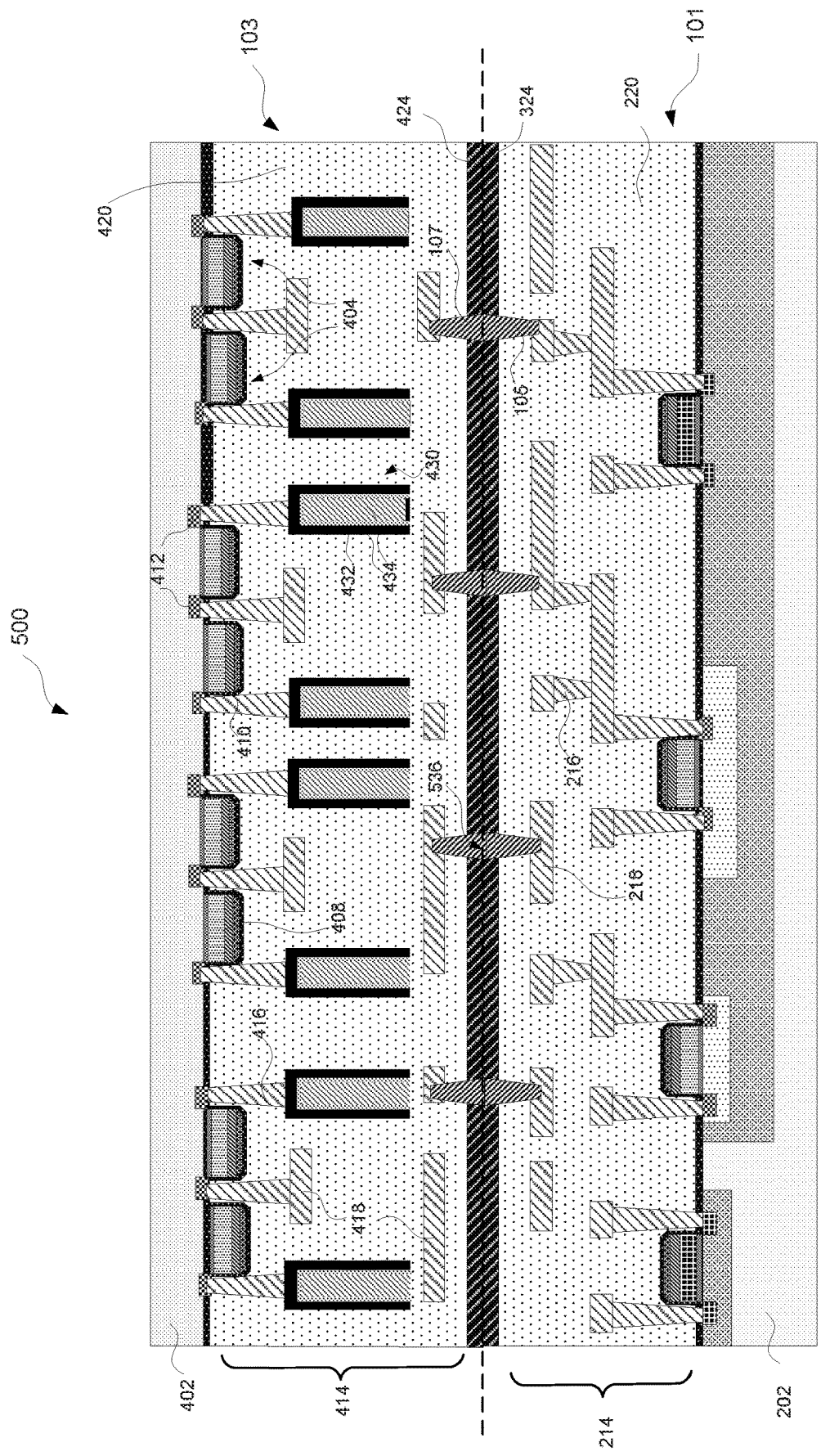
FIG. 5 illustrates a schematic of an exemplary 3D IC device with a CPU chip and a DRAM chip, according to some embodiments of the present disclosure.

FIG. 5 illustrates a cross-section of an exemplary 3D IC device 500, according to some embodiments of the present disclosure. The 3D IC device 500 illustrates an example of 3D IC device 100 in FIG. 1, where the DRAM chip 103 can be bonded with the CPU chip 101 and electrically connected with the CPU chip 101 through the CPU/DRAM interconnect VIAs 105/107.

In some embodiments, the 3D IC device 500 can include a bonding interface 536 formed between the insulating layer 220 of the CPU interconnect layer 214 and the insulating layer 420 of the DRAM interconnect layer 414. Interconnect VIAs 105/107 can be joined at bonding interface 526 to electrically connect any conductive line 218 or contact structure 216 of the CPU interconnect layer 214 and any conductive line 418 or contact structure 416 of the DRAM interconnect layer 414. As such, the CPU chip 101 and the DRAM chip 103 can be electrically connected.

In some embodiments, the 3D IC device 500 can include a bonding interface 536 formed between the bonding layer 324 of the CPU chip 300 and the bonding layer 424 of the DRAM chip 400. In this example, the interconnect VIAs 105/107 extend through the bonding layer 324/424 respectively and also form electrical connections between any conductive line 218 or contact structure 216 of the CPU interconnect layer 214 and the conductive line 418 or contact structure 416 of the DRAM interconnect layer 414. As such, the CPU chip 101 and the DRAM chip 103 can also be electrically connected.

After bonding, any device or circuit on the CPU chip 101 can be electrically connected to any device or circuit on the DRAM chip 103. FIG. 5 illustrates an embodiment that the DRAM chip 103 is bonded on top of the CPU chip 101. In some embodiments, the CPU chip 101 can be bonded on top of the DRAM chip 103.

Figure 6:
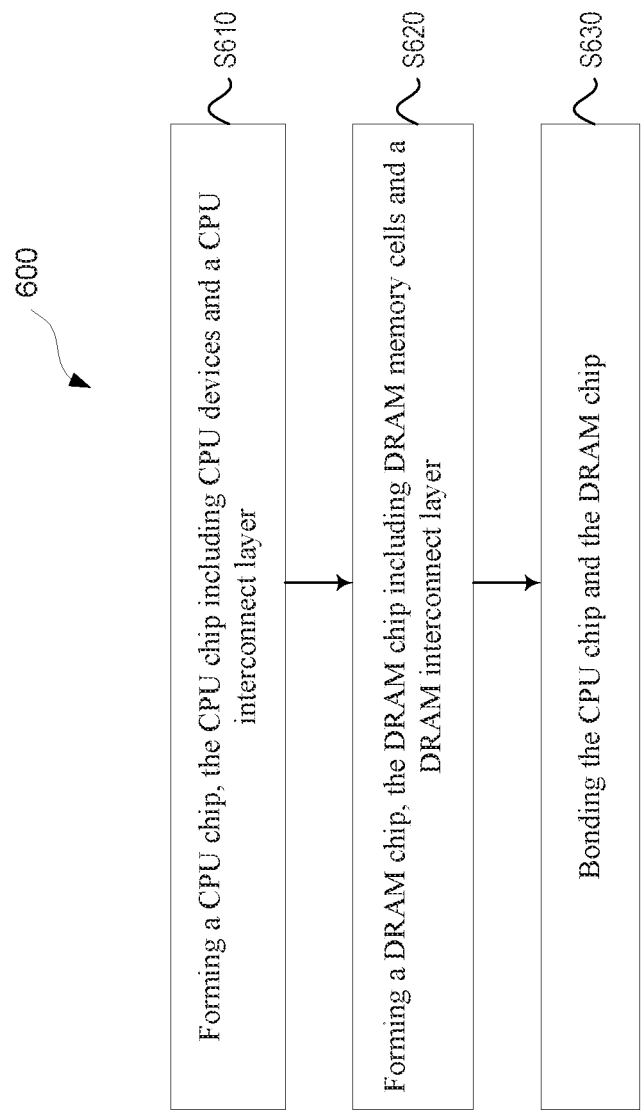
FIG. 6 illustrates a flow diagram of an exemplary method for forming a 3D IC device with a CPU chip and a DRAM chip, according to some embodiments of the present disclosure.

FIG. 6 illustrates an exemplary fabrication process 600 for forming the 3D IC devices shown in FIG. 1-5, in accordance with some embodiments. It should be understood that the operations shown in fabrication process 600 are not exhaustive and that other operations can be performed as well before, after, or between any of the illustrated operations. In some embodiments, some process steps of exemplary fabrication process 600 can be omitted or include other process steps that are not described here for simplicity. In some embodiments, process steps of method 600 can be performed in a different order and/or vary.

As shown in FIG. 6, fabrication process 600 starts at process step S610, in which a microprocessor chip is formed on a first substrate. In some embodiments, the forming of the microprocessor chip includes forming a digital signal processor, a microcontroller, or a central computing unit for a computer or a mobile device. In an example, the microprocessor chip can be the CPU chip 101 shown in FIG. 2, including a CPU device 204 and a CPU interconnect layer 214. The fabrication process for the CPU chip can be similar to fabrication process for the CPU chip 101.

In some embodiments, a plurality of CPU interconnect VIAs can be formed for the CPU chip 101. The CPU interconnect VIAs can be the CPU interconnect VIAs 105 in FIG. 3, and can be made of similar material and formed by using similar processes. The CPU interconnect VIAs are formed to make electrical connections for the CPU chip 101. The fabrication processes for the interconnect VIA include, lithography, trench formation using wet/dry etching, disposing and filling conductive material inside the trench, and removing excess materials outside the trench by using a planarization process such as CMP.

In some embodiments, a bonding layer can be disposed on the CPU chip 101. The bonding layer can be the bonding layer 324 in FIG. 3, and can be fabricated using similar techniques.

At process step S620, a memory chip is formed on a second substrate. In some embodiments, the forming of the memory chip includes forming a static random-access memory, a dynamic random-access memory or a flash memory. In an example, the memory chip can be the DRAM chip 103 shown in FIG. 4A, including DRAM peripheral devices, DRAM memory cells and a DRAM interconnect layer 414.

In some embodiments, a plurality of DRAM interconnect VIAs can be formed for the DRAM chip 103. The DRAM interconnect VIAs can be the DRAM interconnect VIAs 107 in FIG. 4B, and can be formed using similar techniques.

In some embodiments, a bonding layer can be disposed on the DRAM chip 101. The bonding layer can be the bonding layer 424 in FIG. 4B, and can be fabricated using similar techniques.

At process step S630, the DRAM chip can be bonded to the CPU chip to form a 3D IC device, wherein the 3D IC device can be the 3D IC device 500 in FIG. 5.

In some embodiments, the CPU chip 101 and the DRAM chip 103 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where all the dies/chips on the first substrate with the CPU chips 101 can be joined simultaneously with the second substrate with the DRAM chips 103. Individual 3D IC device 500 can be diced after wafer bonding. On the other hand, bonding at die level can be performed after dicing and die test, where functional dies of the CPU chip 101 and DRAM chip 103 can be selected first and then bonded to form 3D IC device 100, enabling higher yield of 3D IC device 500.

In some embodiments, the DRAM chip 103 can be flipped upside down and positioned above the CPU chip (or vice versa). The DRAM interconnect layer 414 of the DRAM chip 103 can be aligned with the CPU interconnect layer 214 of the CPU chip 101.

In some embodiments, aligning the DRAM interconnect layer 414 with CPU interconnect layer 214 is performed by aligning DRAM interconnect VIAs 107 of the DRAM chip 103 with corresponding CPU interconnect VIAs 105 of the CPU chip 101. As a result, corresponding interconnect VIAs can be connected at the bonding interface 536 and the DRAM chip 103 can be electrically connected to the CPU chip 101.

In some embodiments, the CPU chip 101 and the DRAM chip 103 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously. As illustrated in FIG. 1 and FIG. 5, the DRAM chip 103 can be joined with the CPU chip 103, thereby forming a bonding interface 536.

In some embodiments, a bonding layer can be formed on the CPU chip 101 and/or DRAM chip 103 prior to hybrid bonding. The bonding layer can be the bonding layer 324 on the CPU chip 103 shown in FIG. 3, and the bonding layer 424 on the DRAM chip 103 in FIG. 4B. The bonding layer 324/424 can be a dielectric material, for example, silicon nitride, silicon oxynitride, or silicon oxide. At the bonding interface 536, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at the bonding interface 536. The treatment process can prepare the surfaces of DRAM interconnect layer 414 and the CPU interconnect layer 214 so that the surfaces of the insulating layers 220/420 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between the CPU interconnect VIAs 105 and the DRAM interconnect VIAs 107. As a result, metallic materials in the corresponding pairs of the interconnect VIAs can be inter-mixed with each other or forming alloy after the bonding process.

In some embodiments, the first and/or the second substrate can be thinned after bonding. In some embodiments, a handle wafer (e.g., glass, plastic, or silicon) can be attached to the first or the second substrate prior to the thinning process. In some embodiments, substrate thinning process can include one or more of grinding, dry etching, wet etching, and chemical mechanical polishing (CMP).

An example of a second embodiment of the present disclosure will now be described with reference to FIGS. 7 to 15.

Figure 7:
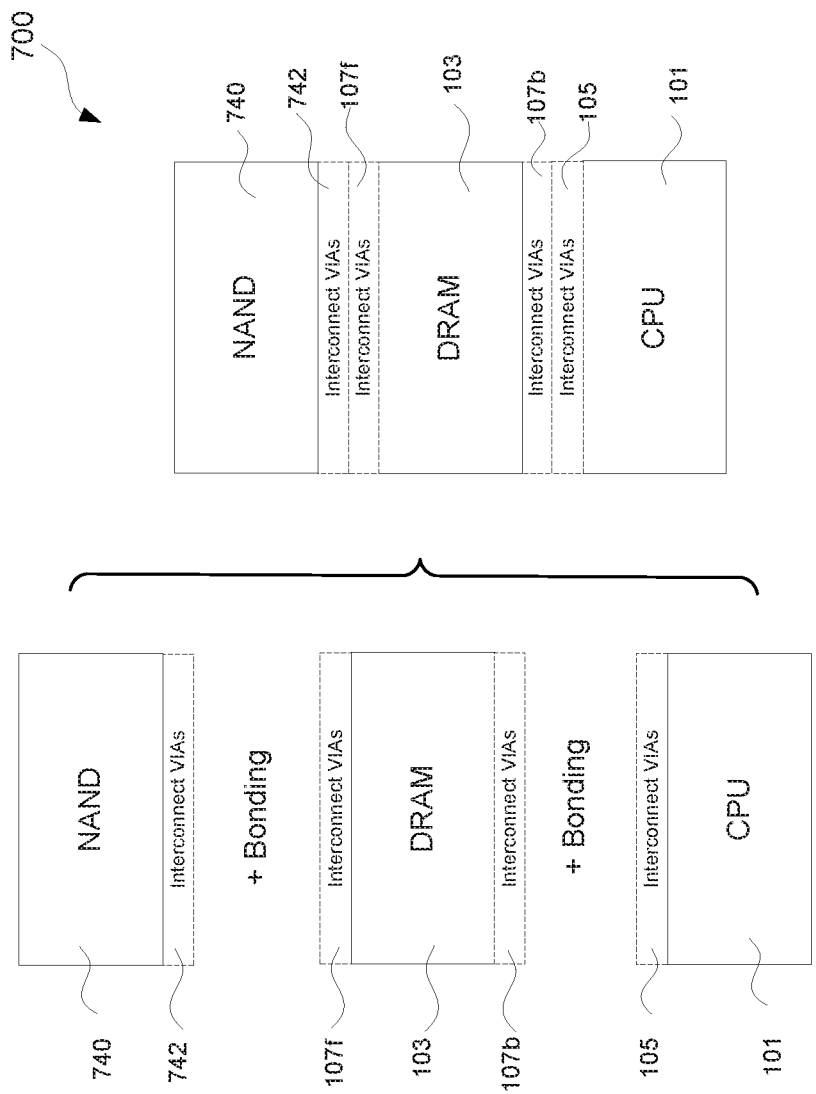
FIG. 7 illustrates a schematic of an exemplary 3D IC device with a CPU chip, a DRAM chip and a NAND chip, according to some embodiments of the present disclosure.

FIG. 7 illustrates a schematic view of an exemplary 3D IC device 700, according to some embodiments of the present disclosure. The 3D IC device 700 can include a microprocessor chip, a first memory chip and a second memory chip. In some embodiments, the microprocessor chip can be any suitable microprocessor, for example, a digital signal processor, a microcontroller, or a central computing unit (CPU) for a computer or a mobile device. In an example, the microprocessor chip can be similar to the microprocessor chip 101 shown in FIGS. 1-3 and is also referred to as the CPU chip 101. In some embodiments, the first memory chip can be any volatile memory, for example, a static random-access memory (SRAM) or a dynamic random-access memory (DRAM). In an example, the first memory chip can be similar to the memory chip 103 shown in FIGS. 1, 4A and 4B and is also referred to as the DRAM chip 103. In some embodiments, the second memory chip can be any suitable non-volatile memory such as a phase change memory, a magnetic random-access memory, a flash memory, etc. In an example, the second memory chip can be a NAND flash memory and is referred to as the NAND chip 740.

The CPU chip 101 includes a plurality of CPU interconnect VIAs 105, similar to that in the first embodiment and depicted in FIGS. 1 and 3. The NAND chip 740 also includes a plurality of NAND interconnect VIAs 742. The DRAM chip 103 includes a plurality of DRAM interconnect VIAs 107f and 107b on a top and bottom sides of the DRAM chip 103, respectively. The "top" side of the chip is referred to as the side where functional devices (e.g., transistors, diodes, etc.) are fabricated. The "bottom" side of the chip is opposite of the top side.

Through hybrid bonding, the NAND chip 740, the DRAM chip 103 and the CPU 101 can be joined together to form the 3D IC device 700. The DRAM chip 103 and the CPU chip 101 can be electrically connected together through the CPU/DRAM interconnect VIAs 105/107b, while the DRAM chip 103 and the NAND chip 740 can be electrically connected together through the DRAM/NAND interconnect VIAs 107f/742.

Figure 8:
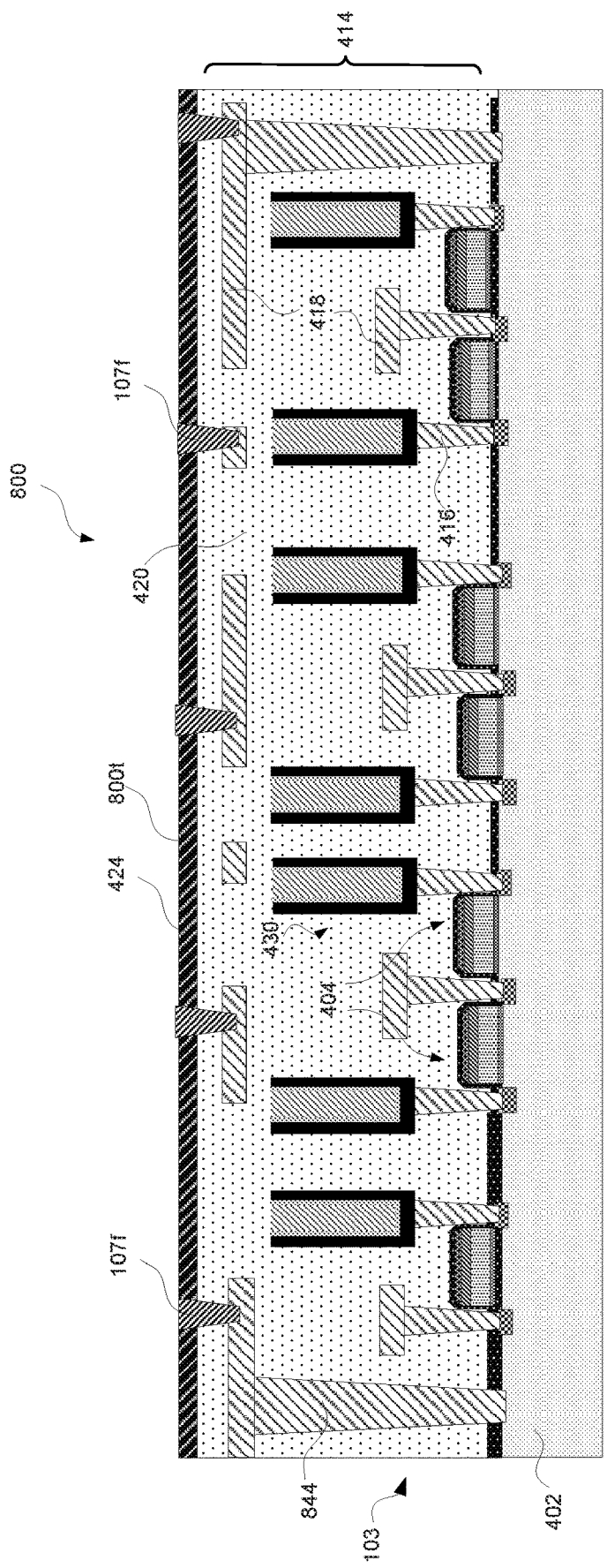
FIG. 8 illustrates a schematic cross-sectional view of a DRAM chip at certain process stage, according to some embodiments of the present disclosure.

FIG. 8 illustrates a cross-section of an exemplary DRAM chip 800 at certain process stage, according to some embodiments of the present disclosure. The DRAM chip 800 can be similar to the DRAM chip 400 in FIG. 4B, including the DRAM chip 103, the bonding layer 424 disposed on the DRAM chip 103, and a plurality of DRAM interconnect VIAs 107f formed on the top side of the DRAM chip 103.

In some embodiments, the DRAM chip 800 also includes a DRAM substrate contact 844. The DRAM substrate contact 844 can be formed using similar material and process as the contact structure 416. The DRAM substrate contact 844 can provide electrical connection to the DRAM substrate 402. In some embodiments, a plurality of metal levels with contact structures 416 and conductive lines 418 can be connected with the substrate contact 844.

In some embodiments, DRAM substrate 402 can be double-side polished prior to DRAM device 404 fabrication. In this example, the DRAM substrate 402 includes surfaces on the top and bottom side both polished and treated to provide a smooth surface for high quality semiconductor devices. In some embodiments, the DRAM substrate 402 can be thinned down from a standard wafer thickness (about 700 µm for a silicon substrate) to a thickness mechanically strong enough to support the subsequent structures, for example, about 200 µm thick for a 200 mm silicon wafer.

Figure 9:
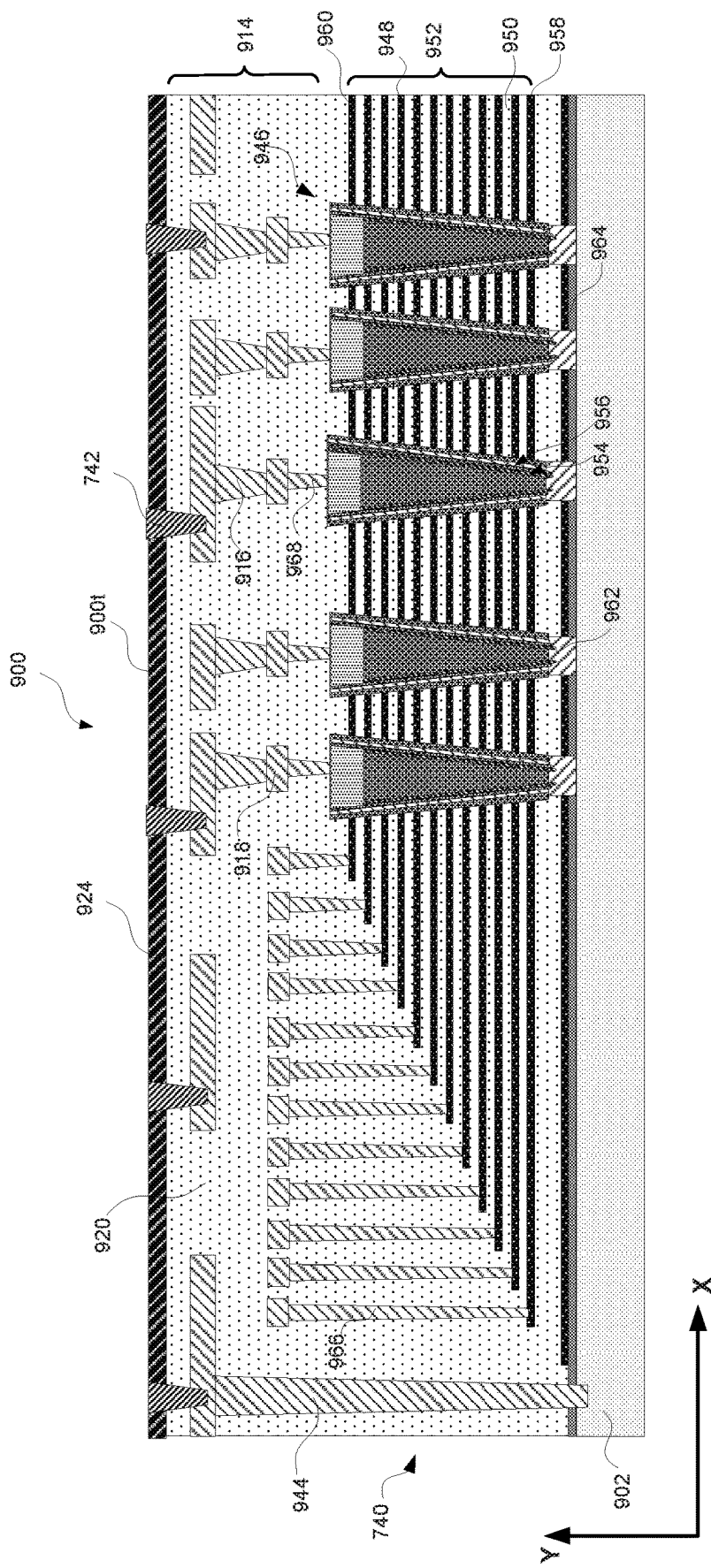
FIG. 9 illustrates a schematic cross-sectional view of a NAND chip at certain process stage, according to some embodiments of the present disclosure.

FIG. 9 illustrates a cross-section of an exemplary NAND chip 900 at certain process stage, according to some embodiments of the present disclosure. The NAND chip 900 can include the NAND chip 740, a bonding layer 924 disposed on the NAND chip 740, and a plurality of the NAND interconnect VIAs 742, where the NAND interconnect VIA 742 extends through the bonding layer 924 and forms electrical connection with the NAND chip 740.

The NAND chip 740 can include a NAND substrate 902, peripheral devices (not shown), NAND memory cells and a NAND interconnect layer 914. The NAND substrate 902 can be similar to the CPU substrate 202. The NAND interconnect layer 914 can be similar as the CPU interconnect layer 214 and can be formed using similar materials and similar processes. For example, interconnect structures (e.g., contact structures 916 and conductive lines 918) and insulating layer 920 of the NAND interconnect layer 914 are similar to the interconnect structures (e.g., contact structures 216, conductive lines 218) and insulating layer 220 of the CPU interconnect layer 214, respectively.

In some embodiments, the NAND peripheral device can include any active and/or passive semiconductor devices, such as transistors, diodes, capacitors, resistors, etc. A plurality of NAND peripheral devices can form suitable digital, analog, and/or mixed-signal peripheral circuits to support the operation of the NAND chip 740. For example, the peripheral circuit can include a page buffer, a decoder (e.g., a row decoder and a column decoder), a sense amplifier, a driver, a charge pump, timing and controls, and the like circuitry. The NAND peripheral device can be similar to the CPU device 204 and can be formed using similar processes.

It is noted that x and y axes are added in FIG. 9 to further illustrate the spatial relationship of the components in NAND chip 900. The substrate 902 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., the NAND chip 900) is determined relative to the substrate of the semiconductor device (e.g., the substrate 902) in the y-direction (the vertical direction or thickness direction) when the substrate is positioned in the lowest plane of the semiconductor device in the y-direction. The same notion for describing spatial relationship is applied throughout the present disclosure.

In some embodiments, the NAND chip 740 can be a 3D NAND Flash memory in which the NAND memory cells includes an NAND memory string 946. The NAND memory string 946 extends through a plurality of conductor layer 948 and dielectric layer 950 pairs. The plurality of conductor/dielectric layer pairs are also referred to herein as an "alternating conductor/dielectric stack" 952. The conductor layers 948 and the dielectric layers 950 in alternating conductor/dielectric stack 952 alternate in the vertical direction. In other words, except the ones at the top or bottom of the alternating conductor/dielectric stack 952, each conductor layer 948 can be sandwiched by two dielectric layers 950 on both sides, and each dielectric layer 950 can be sandwiched by two conductor layers 948 on both sides. The conductor layers 948 can each have the same thickness or have different thicknesses. Similarly, the dielectric layers 950 can each have the same thickness or have different thicknesses. In some embodiments, the alternating conductor/dielectric stack 952 includes more conductor layers or more dielectric layers with different materials and/or thicknesses than the conductor/dielectric layer pair. The conductor layers 948 can include conductor materials such as W, Co, Cu, Al, Ti, Ta, TiN, TaN, Ni, doped silicon, silicides (e.g., NiSix, WSix, CoSix, TiSix) or any combination thereof. The dielectric layers 950 can include dielectric materials such as silicon oxide, silicon nitride, silicon oxynitride, or any combination thereof.

As shown in FIG. 9, each NAND memory string 946 can include a semiconductor channel 954 and a memory film 956. In some embodiments, the semiconductor channel 954 includes silicon, such as amorphous silicon, polysilicon, or single crystalline silicon. In some embodiments, the memory film 956 is a composite layer including a tunneling layer, a storage layer (also known as "charge trap/storage layer"), and a blocking layer. Each NAND memory string 946 can have a cylinder shape (e.g., a pillar shape). The semiconductor channel 954, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the memory film 956 includes ONO dielectrics (e.g., a tunneling layer including silicon oxide, a storage layer including silicon nitride, and a blocking layer including silicon oxide).

In some embodiments, the NAND memory strings 946 further include a plurality of control gates (each being part of a word line for NAND memory strings 946). Each conductor layer 948 in alternating conductor/dielectric stack 952 can act as a control gate for each memory cell of NAND memory string 946. As shown in FIG. 9, the NAND memory string 946 can include a lower select gate 958 (e.g., a source select gate) at a lower end of the NAND memory string 946. The NAND memory string 946 can also include a top select gate 960 (e.g., a drain select gate) at an upper end of the NAND memory string 946. As used herein, the "upper end" of a component (e.g., NAND memory string 946) is the end further away from NAND substrate 902 in the y-direction, and the "lower end" of the component (e.g., NAND memory string 946) is the end closer to NAND substrate 902 in the y-direction. As shown in FIG. 9, for each NAND memory string 946, the drain select gate 960 can be above the source select gate 958. In some embodiments, the select gates 958/960 include conductor materials such as W, Co, Cu, Al, doped silicon, silicides, or any combination thereof.

In some embodiments, the NAND chip 740 includes an epitaxial layer 962 on an lower end of the semiconductor channel 954 of the NAND memory string 946. The epitaxial layer 962 can include a semiconductor material, such as silicon. The epitaxial layer 962 can be epitaxially grown from a semiconductor layer 964 on the NAND substrate 902. The semiconductor layer 964 can be un-doped, partially doped (in the thickness direction and/or the width direction), or fully doped by p-type or n-type dopants. For each NAND memory string 946, the epitaxial layer 962 is referred to herein as an "epitaxial plug." The epitaxial plug 962 at the lower end of each NAND memory string 946 can contact both the semiconductor channel 954 and a doped region of semiconductor layer 964. The epitaxial plug 962 can function as the channel of the lower selective gate 958 at the lower end of NAND memory string 946.

In some embodiments, the array device further includes multiple word line contacts 966 in a staircase structure region. Each word line contact 966 can form electrical contact with a corresponding conductor layer 948 in alternating conductor/dielectric stack 952 to individually control a memory cell. The word line contact 966 can be formed by dry/wet etching of a contact hole, followed by filling with a conductor, for example, W, Ti, TiN, Cu, TaN, Al, Co, Ni, or any combination thereof.

As shown in FIG. 9, the NAND chip 740 also includes bit line contacts 968 formed on the top of the NAND memory strings 946 to provide individual access to the semiconductor channels 954 of the NAND memory strings 946.

The conductive lines connected to the word line contacts 966 and the bit line contacts 968 form word lines and bit lines of the NAND chip 740. Typically the word lines and bit lines are laid perpendicular to each other (e.g., in rows and columns, respectively), forming an "array" of the memory.

In some embodiments, the NAND chip 900 also includes a NAND substrate contact 944. The NAND substrate contact 944 can be formed using similar material and process as the contact structure 916. The NAND substrate contact 944 can provide electrical connection to the NAND substrate 902 from a top surface 900*t* of the NAND chip 900 through the NAND interconnect VIA 742. In some embodiments, a plurality of metal levels with contact structures 916 and conductive lines 918 can be used in connecting the substrate contact 944.

Figure 10:
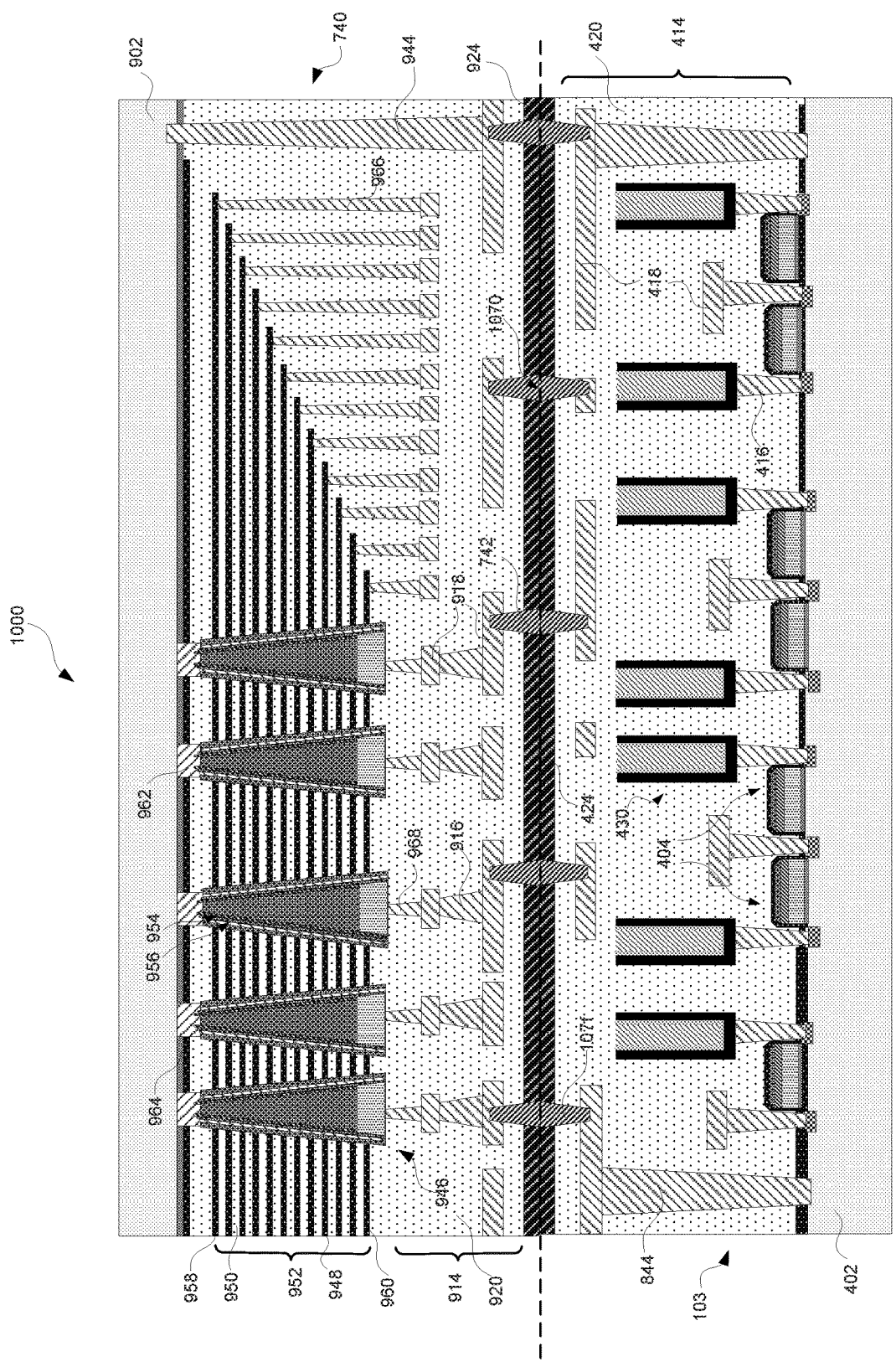
FIG. 10-12 illustrate schematic cross-sectional views of an exemplary 3D IC device with a DRAM chip and a NAND chip at various process stages, according to some embodiments of the present disclosure.

FIG. 10 illustrates a cross-section of an exemplary 3D IC device 1000, according to some embodiments of the present disclosure. The 3D IC device 1000 includes the DRAM chip 103 and the NAND chip 740, where the NAND chip 740 can be bonded with the DRAM chip 103, similar to the structure and method used for 3D IC device 500 in FIG. 5. The NAND chip 740 and the DRAM chip 103 can be bonded together at die/chip level or at wafer level to form 3D IC device 1000. The NAND interconnect VIAs 742 and DRAM interconnect VIAs 107*f* can form electrical connections after the bonding.

In some embodiments, the 3D IC device 1000 can include a first bonding interface 1070 formed between the insulating layer 420 of the DRAM interconnect layer 414 and the insulating layer 920 of the NAND interconnect layer 914. Interconnect VIAs 107*f*/742 can be joined at the first bonding interface 1070 to electrically connect the conductive lines 418/contact structures 416 of the DRAM interconnect layer 414 with the conductive line 918/contact structures 916 of the NAND interconnect layer 914. As such, the DRAM chip 103 and the NAND chip 740 can be electrically connected.

In some embodiments, the 3D IC device 1000 can include the first bonding interface 1070 formed between the bonding layer 424 of the DRAM chip 800 and the bonding layer 924 of the NAND chip 900. In this example, the interconnect VIAs 107*f*/742 extend through the bonding layer 424/924, respectively, and also form electrical connections between the conductive line 418/contact structure 416 of the DRAM interconnect layer 414 and the conductive line 918/contact structure 916 of the NAND interconnect layer 914. As such, the devices and circuits on the DRAM chip 103 and the NAND chip 740 can be electrically connected.

In some embodiments, the 3D IC device 1000 can include the DRAM substrate contact 844 connected to the conductive line 418 and the contact structure 416 of DRAM chip 103. In some embodiments, the 3D IC device 1000 can include the NAND substrate contact 944 connected to the conductive line 918 and the contact structure 916 of NAND chip 740.

In some embodiments, the 3D IC device 1000 can include the DRAM substrate contact 844 connected to the NAND substrate contact 944 at the first bonding interface 1070 through DRAM/NAND interconnect VIAs 107*f*/742 DRAM/NAND. In some embodiments, the 3D IC device 1000 can include the DRAM substrate contact 844 connected to the conductive line 918 and the contact structure 916 of the NAND chip 740. In some embodiments, the 3D IC device 1000 can include the NAND substrate contact 944 connected to the conductive line 418 and the contact structure 416 of the DRAM chip 103. In these examples, the electrical connections cross over the first bonding interface 1070.

After bonding, any device or circuit on the DRAM chip 103 can be electrically connected to any device or circuit on the NAND chip 740. FIG. 10 illustrates an embodiment that the NAND chip 740 is bonded on top of the DRAM chip 103. In some embodiments, the DRAM chip 103 can be bonded on top of the NAND chip 740.

Figure 11:
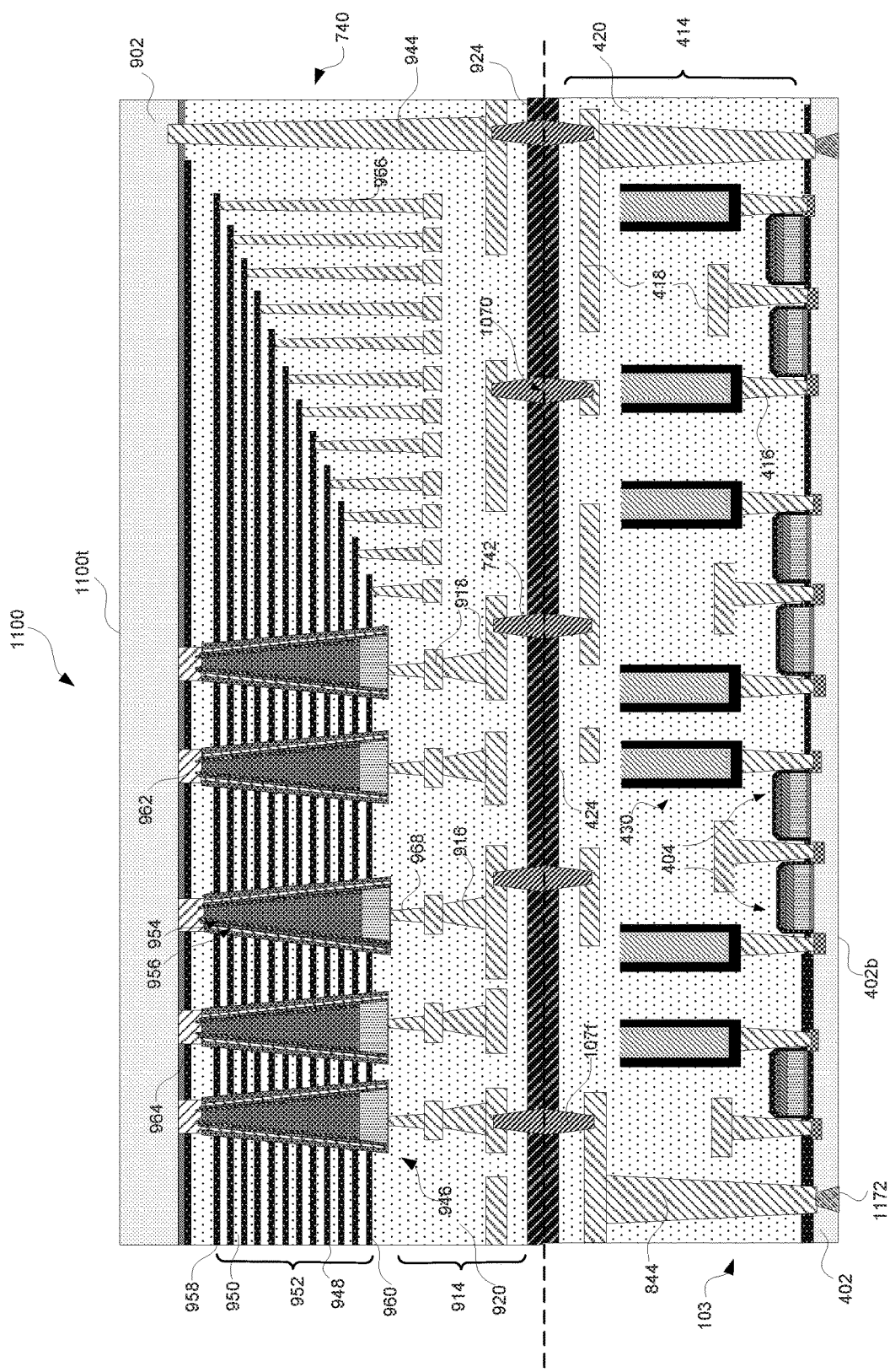

FIG. 11 illustrates a cross-section of an exemplary 3D IC device 1100, according to some embodiments of the present disclosure. The 3D IC device 1100 includes a vertical interconnect structure (also referred to as through-silicon-VIA (TSV)) 1172 formed in the DRAM substrate 402 of the 3D IC device 1000 (in FIG. 10), wherein the TSV 1172 forms an electrical connection with the DRAM substrate contact 844.

In some embodiments, an electrical connection can be formed between the TSV 1172, the DRAM substrate contact 844, the conductive line 418 and/or contact structure 416 of the DRAM chip. In this example, any device or circuit on the DRAM chip 103 can be electrically wired to the bottom surface 402*b* through TSV 1172.

In some embodiments, an electrical connection can be formed between the TSV 1172, the DRAM substrate contact 844 and the DRAM/NAND interconnect VIAs 107*f*/742. As such, electrical connection can be established from the TSV 1172 of the DRAM chip 103 to any device or circuit on the NAND chip 740 through various electrical paths using the contact structure 916, conductive line 918 or substrate contact 944 of the NAND chip 740.

In some embodiments, the TSV 1172 can be formed after thinning the DRAM substrate 402 using grinding, CMP, ME, wet chemical etching, etc. In some embodiments, a protective film can be disposed over the 3D IC device 1100 prior to thinning process on the DRAM substrate 402. The protective film can include photoresist, polyimide, silicon oxide, silicon nitride, etc., and can be removed after the thinning process.

In some embodiments, the 3D IC device 1100 can also include the through-silicon-VIA (TSV) 1172 in the NAND substrate 902 from a surface 1100*t* of the 3D IC device 1100 (not shown in FIG. 11), wherein the TSV 1172 can form an electrical connection with the NAND substrate contact 944. In some embodiments, an electrical connection can be formed between the TSV 1172, the NAND substrate contact 944, the conductive line 918 and/or contact structure 916 of the NAND chip 740. In this example, any device or circuit on the NAND chip 740 can be electrically wired to the surface 1100*t* through TSV 1172. In some embodiments, an electrical connection can be formed between the TSV 1172 in the NAND substrate 902, the NAND substrate contact 944, and the DRAM/NAND interconnect VIAs 107*f*/742. As such, electrical connection can be established from the TSV 1172 of the NAND chip 740 to any device or circuit on the DRAM chip 103 through various electrical paths using the contact structure 416, conductive line 418 or substrate contact 844 of the DRAM chip 103.

Figure 12:
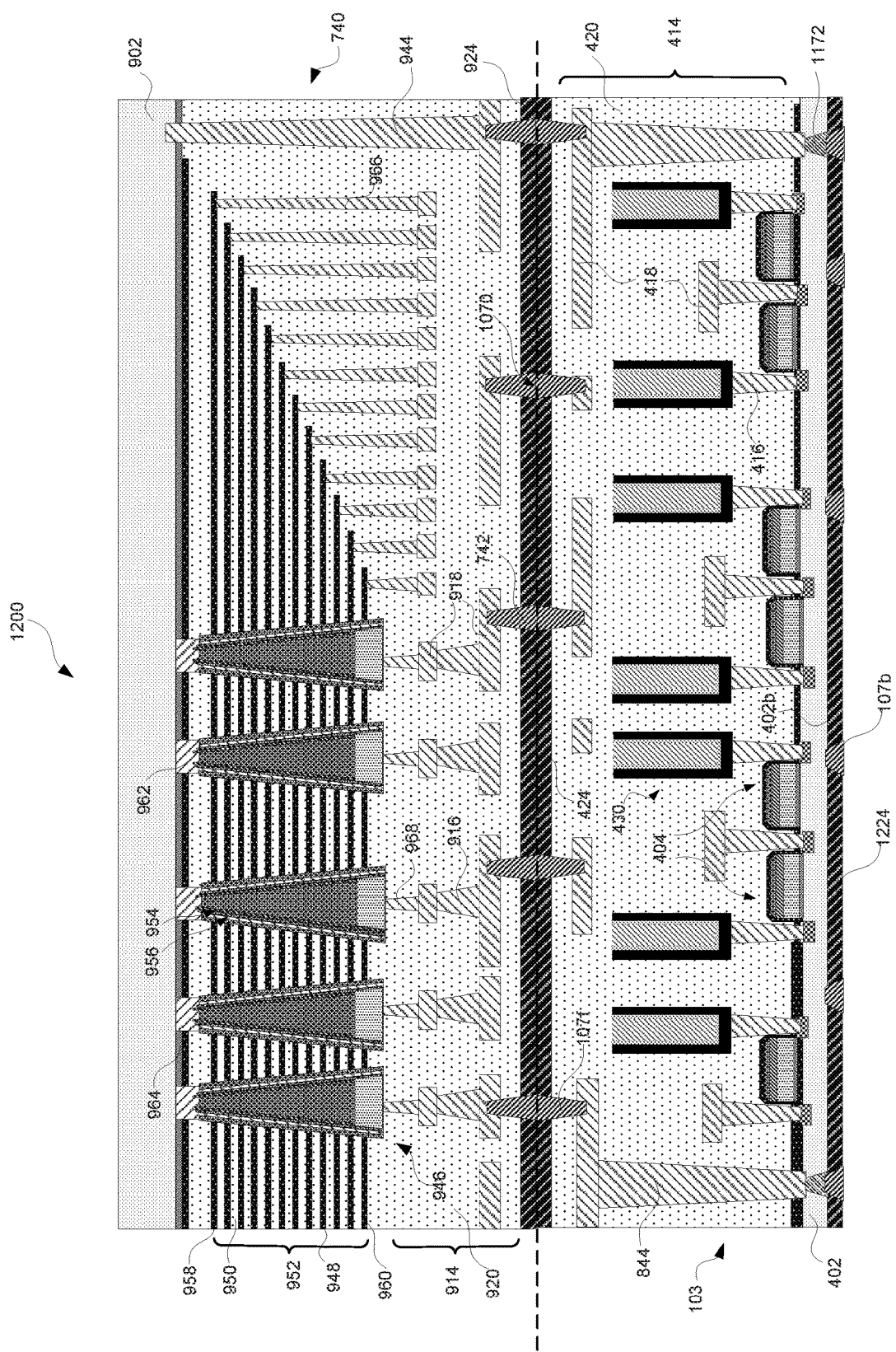

FIG. 12 illustrates a cross-section of an exemplary 3D IC device 1200, according to some embodiments of the present disclosure. The 3D IC device 1200 includes a bonding layer 1224 and a plurality of DRAM interconnect VIAs 107*b* formed on the bottom surface 420*b* of the 3D IC device 1100 in FIG. 11, wherein the DRAM interconnect VIAs 107*b* extend through the bonding layer 1224. The bonding layer 1224 and the DRAM interconnect VIA 107*b* are similar to the bonding layer 424 and the DRAM interconnect VIA 107*f* and are formed by similar material and processes.

In some embodiments, the DRAM interconnect VIA 107*b* is disposed on the TSV 1172 and forms electrical connection with the TSV 1172. In FIG. 12, for simplicity, not all TSVs 1172 are drawn to shown electrical connections with the DRAM interconnect VIAs 107*b*.

Figure 13:
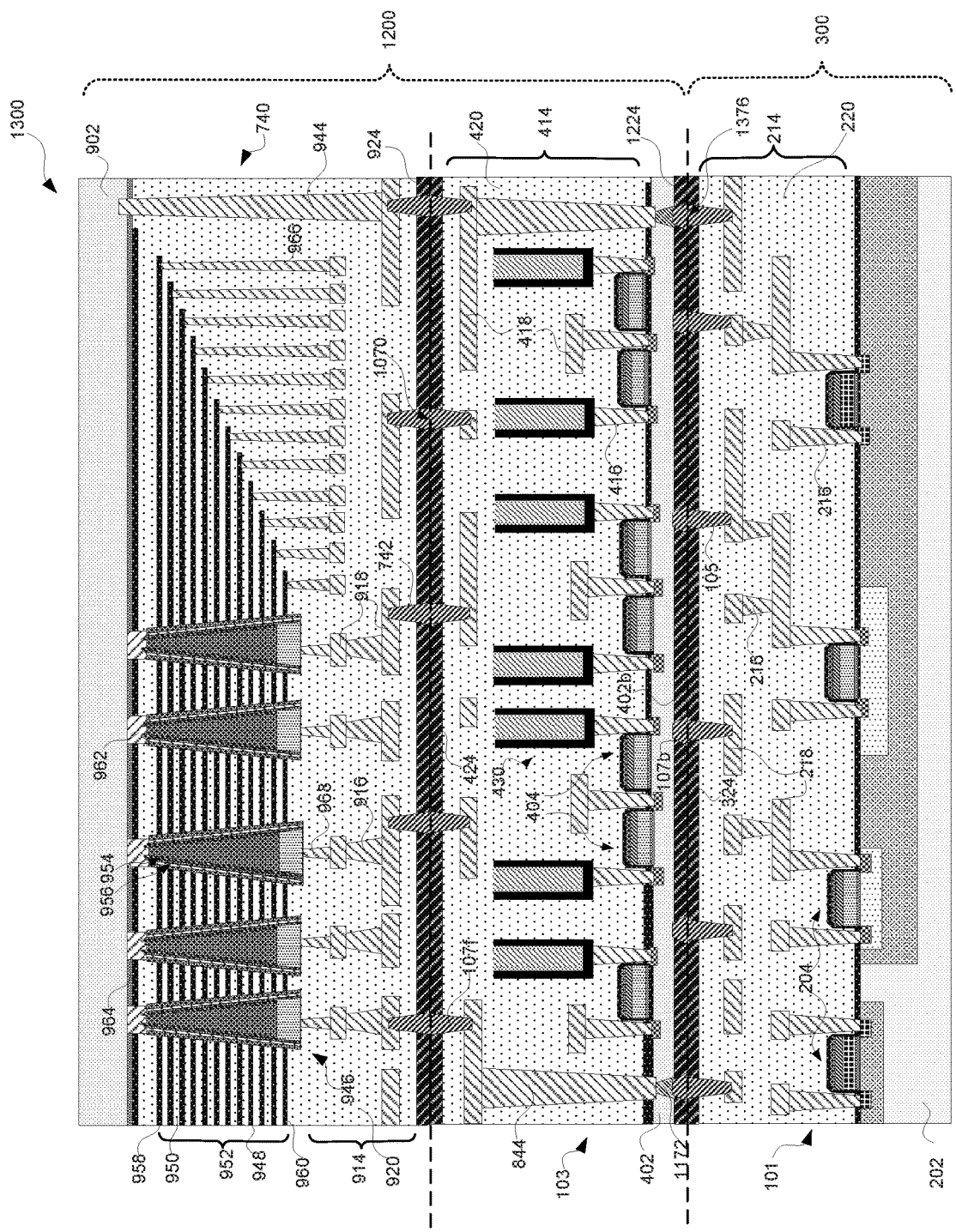
FIG. 13-14 illustrate schematic cross-sectional views of an exemplary 3D IC device with a NAND chip, a DRAM chip and a CPU chip at various process stages, according to some embodiments of the present disclosure.

FIG. 13 illustrates a cross-section of an exemplary 3D IC device 1300, according to some embodiments of the present disclosure. The 3D IC device 1300 includes the 3D IC device 1200 (shown in FIG. 12) and the CPU chip 300 (shown in FIG. 3), wherein the 3D IC device 1200 is bonded to the CPU chip 300 with a second bonding interface 1376. The CPU interconnect VIA 105 on the CPU chip 300 is in electrical contact with the DRAM interconnect VIA 107*b* on the 3D IC device 1200. The 3D IC device 1200 and the CPU chip 300 can be bonded together at die/chip level or at wafer level to form 3D IC device 1300.

In some embodiments, the 3D IC device 1300 can include the second bonding interface 1376 formed between the insulating layer 220 of the CPU interconnect layer 214 and the DRAM substrate 402 of the 3D IC device 1200. Interconnect VIAs 107b/105 can be joined at the second bonding interface 1376 to electrically connect the conductive lines 218/contact structures 216 of the CPU interconnect layer 214 with the TSVs 1172 of the 3D IC device 1200. As such, the CPU chip 101 and the DRAM chip 103 can be electrically connected. Through the TSV 1172, the DRAM substrate contact 844, the conductive lines 218/418 and/or the contact structures 216/416 on the CPU/DRAM chip 101/103, any device and circuit on the DRAM chip 103 can be electrically connected with any device and circuit on the CPU chip 101.

In some embodiments, the CPU chip 101 can also include CPU substrate contacts (not shown in FIG. 13), similar to the DRAM substrate contacts 844. The CPU substrate contacts can provide further electrical path between the DRAM chip 103 and the CPU chip 101 or within the CPU chip 101.

In some embodiments, the DRAM substrate 402 can also include a dielectric layer on the bottom surface 402b (not shown in FIG. 13). The second bonding interface 1376 can be formed between the dielectric layer on the bottom surface 402b of the DRAM substrate 402 and the insulating layer 220 of the CPU interconnect layer 214. The dielectric layer on the bottom surface 402b of the DRAM substrate 402 can include silicon oxide, silicon nitride, silicon oxynitride, or any combination thereof.

In some embodiments, the 3D IC device 1300 can include the second bonding interface 1376 formed between the bonding layer 1224 of the DRAM chip 103 and the bonding layer 324 of the CPU chip 300. In this example, the interconnect VIAs 107b/105 extend through the bonding layer 324/1224, respectively, and also form electrical connections between the TSV 1172 of the DRAM chip 103 and the conductive line 218/contact structure 216 of the CPU interconnect layer 214. As such, through the TSV 1172, the substrate contact 844, the conductive lines 218/418 and/or the contact structures 216/416 on the CPU/DRAM chip 101/103, any devices and circuits on the CPU chip 101 and the DRAM chip 103 can be electrically connected.

In some embodiments, the 3D IC device 1300 includes three electrically connected chips, e.g., the CPU chip 101, the DRAM chip 103 and the NAND chip 740, wherein the NAND chip 740 and the DRAM chip 103 are bonded at the first bonding interface 1070, and the DRAM chip 103 and the CPU chip 101 are bonded at the second bonding interface 1376. Across the first bonding interface 1070, any device or circuit on the NAND chip 740 can be electrically connected with any device or circuit on the DRAM chip 103. Across the second bonding interface 1376, any device or circuit on the DRAM chip 103 can be electrically connected to any device or circuit on the CPU chip 101.

In some embodiments, the NAND chip 740 includes the substrate contact 944 and the DRAM chip 103 includes the substrate contact 844. In this example, a direct electrical connection can be formed between the NAND substrate contact 944 and the DRAM substrate contact 844 through the interconnect VIAs 742/107f with minimum number of conductive lines 418/918 and contact structures 416/916. As such, any device/circuit on the CPU chip 101 can be directly connected to any device/circuit on the NAND chip 740 without extensive length of wirings through the DRAM chip 103.

In some embodiments, the CPU chip 101 can also include substrate contacts (not shown in FIG. 13). In this example, external signals can be sent to any one of the three chips on the 3D IC device 1300 in parallel. The CPU chip 101, DRAM chip 103 and the NAND chip 740 can be accessed individually and directly by an external device.

FIG. 13 illustrated an example of the 3D IC device 1300 where the DRAM chip 103 is bonded to the NAND chip 740 first forming 3D IC device 1000 (see FIG. 10), where the top side of DRAM chip 103 facing the top side of the NAND chip 740 while the bottom of the NAND substrate 902 and the bottom of the DRAM substrate 402 forming the two sides of the 3D IC device 1000 after bonding. Here, the "top" side of a substrate is referred to the side where active semiconductor devices are formed. In this example, the top side of the CPU chip 101 is bonded subsequently to the bottom surface of the DRAM substrate 402 during the second bonding process to form the 3D IC device 1300.

In some embodiments, the CPU chip 101 can be bonded to the DRAM chip 103 first, where the top side of the CPU chip 101 facing the top side of the DRAM chip 103. In this example, the NAND chip 740 can be bonded subsequently to the DRAM chip 103, where the top side of the NAND chip 740 facing the bottom side of the DRAM substrate 402.

Figure 14:
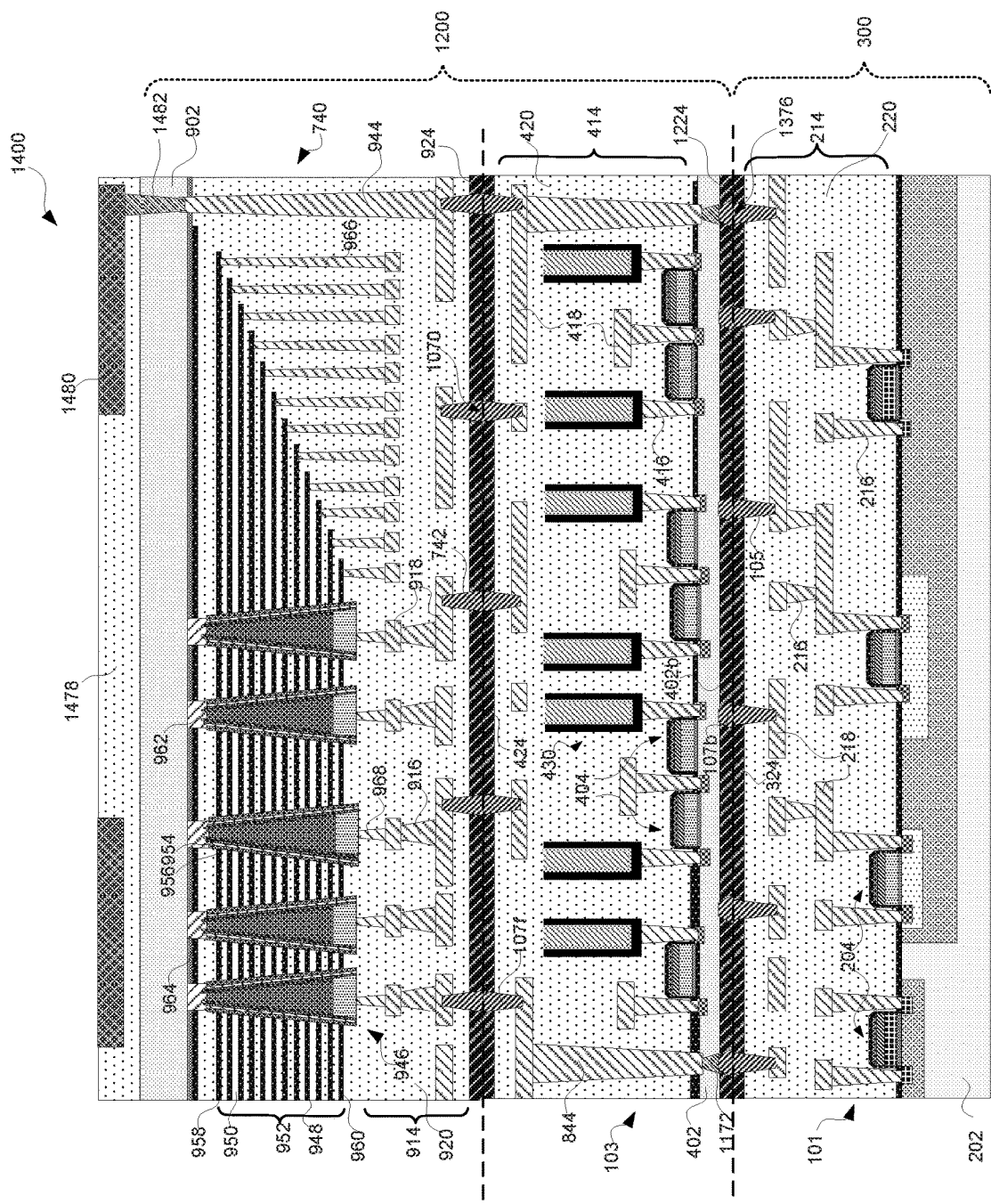

FIG. 14 illustrates a cross-section of an exemplary 3D IC device 1400, according to some embodiments of the present disclosure, wherein the 3D IC device 1400 includes an insulating film 1478 disposed on the NAND substrate 902 of the 3D IC device 1300 in FIG. 13, one or more input/output (I/O) pads 1480 formed in the insulating film 1478, and one or more TSVs 1482 connecting the I/O pads to the substrate contacts 944 through the NAND substrate 902. The TSV 1482 can be similar to the TSV 1172 of the DRAM chip 103 and can be formed using similar process.

The insulating film 1478 can be any suitable insulating material, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating film 1478 can be deposited by one or more thin film deposition processes such as CVD, PVD, PECVD, ALD, high-density-plasma CVD (HDP-CVD), sputtering, spin-coating, or any combination thereof.

In some embodiments, the I/O pad 1480 is coplanar with the insulating film 1478. In some embodiments, the I/O pad 1480 can be extruded or recessed from the insulating film 1478. The I/O pad 1480 can include any suitable conductive material, for example, copper (Cu), tin (Sn), nickel (Ni), gold (Au), silver (Ag), titanium (Ti), aluminum (Al), TiN, TaN, Al, or any combination thereof. The I/O pad 1480 can be disposed by one or more thin film deposition processes such as chemical vapor deposition (CVD), plasma-enhanced CVD (PECVD), physical vapor deposition (PVD), electroplating, electroless plating, sputtering, evaporation, or any combination thereof. The fabrication process of the I/O pad 1480 can also include, but not limited to, lithography, wet/dry etching, planarization (e.g., RIE etch-back and CMP).

In some embodiments, the insulating film 1478, the I/O pad 1480 and the TSV 1482 can also be formed on the CPU substrate 202. In this example, the CPU chip 101 can include one or more substrate contacts as well.

Through the I/O pads 1480, external devices can be connected to the 3D IC device 1400. In some embodiments, through the I/O pads 1480, external devices can be connected to any device or circuit on the NAND chip 740, the DRAM chip 103 and/or the CPU chip 101.

FIG. 15 illustrates an exemplary fabrication process 1500 for forming the 3D IC devices shown in FIG. 7-14, in accordance with some embodiments. It should be understood that the operations shown in fabrication process 1500 are not exhaustive and that other operations can be performed as well before, after, or between any of the illustrated operations. In some embodiments, some process steps of exemplary fabrication process 1500 can be omitted or include other process steps that are not described here for simplicity. In some embodiments, process steps of method 1500 can be performed in a different order and/or vary.

At process step S1510, a first memory chip is formed on a first substrate. In some embodiments, the forming of the first memory chip includes forming a static random-access memory or a dynamic random-access memory. In an example, the first memory chip can be the DRAM chip 103 in FIG. 8. The DRAM chip 103 can include DRAM peripheral devices, DRAM memory cells and the DRAM interconnect layer 414. The fabrication process of DRAM chip 103 is described with respect to FIGS. 4A and 4B, at process step S620 in FIG. 6, and FIG. 8.

In some embodiments, the DRAM chip includes a bonding layer, a plurality of interconnect VIAs and a substrate contact on the top side, which are illustrated, for example in FIG. 8, as the bonding layer 424, the DRAM interconnect VIAs 107*f* and the DRAM substrate contact 844. The top side of the DRAM chip is referred to the side of the DRAM substrate where the DRAM peripheral devices and memory cells are formed.

In some embodiments, the bonding layer 424 can be disposed on the DRAM chip 740 after completing the DRAM interconnect layer 414. The bonding layer 424 can include dielectric materials such as silicon oxide, silicon nitride, silicon oxynitride or any combination thereof. The bonding layer 424 can also include adhesion materials, for example, epoxy resin, polyimide, dry film, photosensitive polymer, etc. The bonding layer 424 can be formed by one or more thin film deposition processes such as CVD, PVD, PECVD, ALD, high-density-plasma CVD (HDP-CVD), sputtering, spin-coating, or any combination thereof.

In some embodiments, the DRAM interconnect VIAs 107*f* can be formed in the DRAM interconnect layer 414, electrically connected to one or more of the conductive lines 418 and/or the contact structures 416 on the DRAM chip 103. The fabrication process of the DRAM interconnect VIA 107*f* can include photolithography and wet/dry etching to form a trench for the DRAM interconnect VIA 107*f*. Next, a layer of conductive material is disposed on the DRAM chip 103 to fill up the trench for the DRAM interconnect VIA 107*f*. In some embodiments, the DRAM interconnect VIA 107*f* can include conductive material such as copper (Cu), tin (Sn), nickel (Ni), gold (Au), silver (Ag), titanium (Ti), aluminum (Al), tantalum, titanium nitride (TiN), tantalum nitride (TaN), etc., or any combination thereof. The conductive material of DRAM interconnect VIA 107*f* can be formed by one or more thin film deposition processes such as CVD, PVD, plating, sputtering, evaporation, or any combination thereof. The excess conductive material outside of the trench can be removed by using a planarization process (e.g., CMP, or RIE etch-back).

At process step S1520, a second memory chip is formed on a second substrate. In some embodiments, the forming of the second memory chip includes forming a phase change memory, a magnetic random-access memory or a flash memory. In an example, the second memory chip can be the NAND chip 740 in FIG. 9. The NAND chip 740 can include NAND peripheral devices, NAND memory cells and the NAND interconnect layer 914.

In some embodiments, the NAND peripheral devices can be any suitable semiconductor devices, such as n-type MOSFETs, p-type MOSFETs, diodes, resistors, capacitors, inductors, etc. The fabrication processes for the peripheral devices are similar to the CPU devices or DRAM peripheral devices.

In some embodiments, the NAND chip 740 is a 3D NAND flash memory. The NAND memory cells can include a NAND memory string 946 and a staircase structure.

In some embodiments, fabrication of the NAND chip 740 can include forming a plurality of dielectric layer pairs (also referred to herein as an "alternating dielectric stack") with a first dielectric layer 950 and a second dielectric layer (not shown in figures) that is different from first dielectric layer 950. In some embodiments, the first dielectric layer can be silicon oxide and the second dielectric layer can be silicon nitride. Alternating dielectric stack can be formed by one or more thin film deposition processes such as CVD, PVD, ALD, sputtering, or any combination thereof.

In some embodiments, fabrication of the NAND chip 740 can also include forming a staircase structure at an end of the alternating dielectric stack by using multiple etch-trim processes.

In some embodiments, fabrication of the NAND chip 740 can also include removing the second dielectric layer and replacing with a conductor layer 948 to form an alternating conductor/dielectric stack 952. The replacement of the second dielectric layers with conductor layers 948 can be performed by wet etching the second dielectric layers selective to first dielectric layers 950 and filling the structure with conductor layers 948. The conductor layer 948 includes polysilicon, W, Co, Ti, TiN, Ta, TaN, Al, Ni, silicides, etc., and can be filled by CVD, ALD, etc.

In some embodiments, fabrication of the NAND chip 740 can further include forming a plurality of NAND memory strings 946 penetrating alternating conductor/dielectric stack 952. In some embodiments, fabrication processes to form NAND memory strings 946 can include forming a semiconductor channel 954 that extends vertically through alternating conductor/dielectric stack 952. In some embodiments, semiconductor channel 954 can be an amorphous silicon layer or a polysilicon layer formed by using a thin film deposition process, such as a CVD, ALD, etc.

In some embodiments, fabrication processes to form NAND memory strings 946 can further include forming a memory film 956 between semiconductor channel 954 and the plurality of conductor/dielectric layer pairs in alternating conductor/dielectric stack 952. Memory film 956 can be a composite dielectric layer, such as a combination of multiple dielectric layers such as a blocking layer, a storage layer, and a tunneling layer.

The blocking layer can be used for blocking the outflow of the electronic charges. In some embodiments, the blocking layer can be a silicon oxide layer or a combination of silicon oxide/silicon oxynitride/silicon oxide ($SiO_2$—SiON—$SiO_2$) multi-layer stack. In some embodiments, the blocking layer includes high dielectric constant (high-k) dielectrics (e.g., aluminum oxide). In one example, the blocking layer includes a silicon oxide layer formed by In-Situ Steam Generation (ISSG) oxidation after a silicon nitride deposition process.

The storage layer can be used for storing electronic charges. The storage and/or removal of charges in the storage layer can impact the on/off state and/or a conductance of the semiconductor channel. The storage layer can include polycrystalline silicon (polysilicon) or silicon nitride. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes.

The tunneling layer can be used for tunneling electronic charges (electrons or holes). The tunneling layer can be dielectric materials such as silicon oxide, silicon nitride, silicon oxynitride, or any combination thereof. In some embodiments, the tunneling layer can be an oxide layer formed by using a deposition process.

In some embodiments, fabrication of the NAND chip 740 can further include forming an epitaxial layer 962 at an end of NAND memory string 946. In some embodiments, epitaxial layer 962 can be formed in the second substrate, and correspond to each NAND memory string 946 as an epitaxial plug 962. Epitaxial layer 962 can be implanted to a desired doping level.

In some embodiments, fabrication of the NAND chip 740 can further include forming multiple word line contacts. As illustrated in FIG. 9, each word line contact 966 can extend vertically to form electrical contact to a corresponding conductor layer 948 of the staircase structure, wherein each conductor layer 948 can individually control a memory cell of NAND memory strings 946. In some embodiments, fabrication processes to form word line contacts 966 include forming a vertical opening through an insulating layer 920 using dry/wet etch process, followed by filling the opening with conductive materials such as W, Co, Cu, Al, doped poly-silicon, silicides, or any combination thereof. The conductive materials can be disposed by ALD, CVD, PVD, plating, sputtering, or any combination thereof.

In some embodiments, fabrication of the NAND chip 740 can further include forming the NAND interconnect layer 914, which can electrically connect the NAND memory strings with peripheral devices. As shown in FIG. 9, in some embodiments, the NAND interconnect layer 914 can include one or more contact structures 916 and conductive lines 918 in the insulating layer 920. In some embodiments, fabrication processes to form NAND interconnect layer 914 include forming the insulating layer 920, followed by forming a plurality of bit line contacts 968 in contact with NAND memory strings 946 in the insulating layer 920. The insulating layer 920 can include one or more layers of dielectric materials such as silicon oxide, silicon nitride, silicon oxynitride, or any combination thereof. The insulating layer 920 can be formed by one or more thin film deposition processes such as CVD, PVD, PECVD, ALD, high-density-plasma CVD (HDP-CVD), sputtering, spin-coating, or any combination thereof. Bit line contacts 968 can be formed by forming openings in the insulating layer 920, followed by filling the openings with conductive materials such as W, Co, Cu, Al, Ti, TiN, Ta, TaN, doped silicon, silicides, or any combination thereof, deposited by CVD, PVD, sputtering, evaporating, plating, or any combination thereof.

In some embodiments, fabrication processes to form NAND interconnect layer 914 further include forming one or more conductive lines 918 and one or more contact structures 916 in the insulating layer 920. Conductor layers and contact layers can include conductor materials such as W, Co, Cu, Al, Ti, Ta, TiN, TaN, doped silicon, silicides, or any combination thereof. Conductor layers and contact layers can be formed by any suitable known BEOL methods.

In some embodiments, other structures can also be formed on the NAND chip, for example, a bonding layer, a plurality of interconnect VIAs and a substrate contact, which are illustrated in FIG. 9, as the bonding layer 924, the NAND interconnect VIAs 742 and the NAND substrate contact 944.

In some embodiments, the bonding layer 924 can be disposed on the NAND chip 740 after completing the NAND interconnect layer 914. The bonding layer 924 can include dielectric materials such as silicon oxide, silicon nitride, silicon oxynitride or any combination thereof. The bonding layer 924 can also include adhesion materials, for example, epoxy resin, polyimide, dry film, photosensitive polymer, etc. The bonding layer 924 can be formed by one or more thin film deposition processes such as CVD, PVD, PECVD, ALD, high-density-plasma CVD (HDP-CVD), sputtering, spin-coating, or any combination thereof.

In some embodiments, the NAND interconnect VIAs 742 can be formed in the NAND interconnect layer 914, electrically connected to one or more of the conductive lines 918 and/or the contact structures 916 on the NAND chip 740. The fabrication process of the NAND interconnect VIA 742 can include photolithography and wet/dry etching to form a trench for the NAND interconnect VIA 742. Next, a layer of conductive material is disposed on the NAND chip 740 to fill up the trench for the NAND interconnect VIA 742. In some embodiments, the NAND interconnect VIA 742 can include conductive material such as copper (Cu), tin (Sn), nickel (Ni), gold (Au), silver (Ag), titanium (Ti), aluminum (Al), tantalum, titanium nitride (TiN), tantalum nitride (TaN), etc., or any combination thereof. The conductive material of NAND interconnect VIA 742 can be formed by one or more thin film deposition processes such as CVD, PVD, plating, sputtering, evaporation, or any combination thereof. The excess conductive material outside of the trench can be removed by using a planarization process (e.g., CMP, or RIE etch-back).

At process step S1530, the DRAM chip is bonded with the NAND chip to form a first 3D IC device. An example of the first 3D IC device is shown in FIG. 10 as the 3D IC device 1000, where the NAND chip 740 can be flipped upside down and positioned above the DRAM chip 103. In some embodiments, the DRAM chip 103 can be bonded on top of the NAND chip 740.

In some embodiments, the NAND chip 740 and the DRAM chip 103 can be bonded together at die level (e.g., die-to-die, or chip-to-chip) or at wafer level (e.g., wafer-to-wafer or chip-to-wafer).

In some embodiments, the NAND chip 740 is position on the DRAM chip 103 by aligning the NAND interconnect VIAs 742 with corresponding DRAM interconnect VIAs 107f. As a result, corresponding interconnect VIAs can be connected at a first bonding interface 1070, where the DRAM chip 103 can be electrically connected to the NAND chip 740.

In some embodiments, the NAND chip 740 and the DRAM chip 103 can be joined by hybrid bonding, where the bonding can take place between different materials at a bonding interface simultaneously, e.g., metal to metal and dielectric to dielectric. The hybrid bonding process can be similar to the process described at process step S630 in FIG. 6. In this example, metal to metal bonding can take place between the NAND interconnect VIAs 742 and the DRAM interconnect VIAs 107f. The dielectric to dielectric bonding can take place between the insulating layer 920/420 of the NAND/DRAM interconnect layers 914/414, respectively. In some embodiments, the dielectric to dielectric bonding can take place between the bonding layer 924 of the NAND chip 740 and the bonding layer 424 of the DRAM chip 103, wherein the bonding layers 924/424 are dielectric materials, for example, silicon oxide, silicon nitride, or silicon oxynitride. In some embodiments, the bonding layer can also include an adhesive material to enhance bonding strength, for example, epoxy resin, polyimide, dry film, etc.

In some embodiments, a treatment process can be performed before, during or after bonding. The treatment process can include plasma treatment, wet chemical treatment or thermal treatment, and is similar to the process used at process step S630 for the CPU chip and the DRAM chip.

In some embodiments, the substrates of the NAND chip 740 and/or the DRAM chip 103 can be thinned after bonding. In some embodiments, a handle wafer (e.g., glass, plastic, or silicon) can be attached to the NAND/DRAM chip 740/103 prior to the thinning process. In some embodiments, substrate thinning process can include grinding, dry etching, wet etching, and chemical mechanical polishing (CMP).

In some embodiments, a plurality of vertical interconnect structure (e.g., through-silicon-VIAs (TSV)) can be formed for the DRAM chip 103 and/or the NAND chip 740. The TSV for DRAM chip 103 is similar to the TSV 1172 in FIG. 11 and the TSV for NAND chip 740 is similar to the TSV 1482 in FIG. 14. The TSVs can be formed before or after the bonding of the DRAM chip 103 and the NAND chip 740. In some embodiments, TSVs can be formed after substrate thinning.

In some embodiments, the TSV 1172 can be formed from the bottom surface 420b of the DRAM chip 103 by using a patterning process to form a TSV trench followed by conductive material filling and planarization. The patterning process for TSV 1172 can include lithography and etching. In addition to photoresist, an anti-reflective coating (ARC) such as dielectric ARC (DARC) or bottom ARC (BARC) can be used to improve lithography quality and provide extra protection during etching. In some embodiments, a hard mask (e.g., silicon oxide, silicon nitride or silicon oxynitride) can be deposited on the bottom surface 420b of the DRAM substrate 402 prior to TSV 1172 patterning to provide more protection of underlying materials during etching. The etching process for TSV 1172 can include, for example, wet chemical etching, reactive ion etching (ME), high-aspect ratio plasma etching, or any combination thereof. In some embodiments, a deep silicon trench of the TSV 1172 can be formed by alternating plasma etching using $SF_6$ chemistry and protection film deposition using $C_4F_8$ chemistry. The conductive material used to fill the trench of the TSV 1172 can include tungsten (W), cobalt (Co), copper (Cu), titanium (Ti), tantalum (Ta), aluminum (Al), titanium nitride (TiN), tantalum nitride (TaN), nickel, polysilicon, polycrystalline silicon germanium, polycrystalline germanium, silicides ($WSi_x$, $CoSi_x$, $NiSi_x$, $AlSi_x$, etc.), or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof. The excess conductive materials can be removed by a planarization process, for example, RIE etch-back, chemical-mechanical polishing (CMP). The forming of the TSV 1482 for the NAND chip 740 is similar to the TSV 1172 described above.

To prepare the NAND chip 740 and/or the DRAM chip 103 for the next bonding process, in some embodiments, a bonding layer and a plurality of interconnect VIAs can be formed on the bottom side of the DRAM chip after forming the first 3D IC device. Here the "top" side is referred to the side of the DRAM chip 103 where DRAM memory cells are formed. In this example shown in FIG. 12, the top side of the DRAM chip 103 is closer to the bonding interface with the NAND chip 740. Thereby, the bottom side of the DRAM chip is farther away from the bonding interface. The bonding layer and the interconnect VIAs are similar to the bonding layer 1224 and the DRAM interconnect VIA 107b in FIG. 12 and can be formed similarly to the bonding layer 424 and the DRAM interconnect VIA 107f described in process step S1510.

At process step S1540, a microprocessor chip is formed on a third substrate. In some embodiments, the forming of the microprocessor chip includes forming a digital signal processor, a microcontroller, or a central computing unit for a computer or a mobile device. In one example, the microprocessor chip can be a CPU chip, wherein the CPU chip includes a CPU device and a CPU interconnect layer. The CPU chip can also include a bonding layer and a plurality of interconnect VIAs. The CPU chip can be the CPU chip 300 shown in FIG. 3 and using similar processes as described for process step S610 in FIG. 6.

At process step S1550, the first 3D IC device is bonded with the CPU chip to form a second 3D IC device. An example of the second 3D IC device is shown in FIG. 13 as the 3D IC device 1300, where bottom of the DRAM chip 103 can be bonded with the top of the CPU chip 101. In some embodiments, the first 3D IC device and CPU chip can be bonded together at die level (e.g., die-to-die, or chip-to-chip) or at wafer level (e.g., wafer-to-wafer or chip-to-wafer). In some embodiments, the bonding is performed by aligning the DRAM interconnect VIAs 107b on the bottom of the DRAM chip 103 with the corresponding CPU interconnect VIAs 105 on the top of the CPU chip 101.

In some embodiments, the first 3D IC device and the CPU chip 103 can be joined by hybrid bonding, wherein the hybrid bonding process is similar to the process described at process step S1520.

In some embodiments, TSVs can be formed on the CPU chip 101, the DRAM chip 103 and the NAND chip 740. The TSVs are similar to the TSVs 1172 and 1482 in FIG. 11 and FIG. 14, and can be formed with similar processes.

In some embodiments, one or more I/O pads can be formed on the NAND chip 740 and/or the CPU chip 101, connecting to TSVs of the NAND chip 740 and the CPU chip 101, respectively. An example of the I/O pad is shown in FIG. 14 as I/O pad 1480. To form the I/O pad 1480, an insulating film is disposed on the substrate of the NAND chip. In the example shown in FIG. 14, the top side of the NAND chip is closer to the bonding interface, and the insulating film is disposed on the backside of the NAND substrate 902. The insulating film can be the insulating film 1478 in FIG. 14 and can be any suitable insulating material, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating film 1478 can be deposited by one or more thin film deposition processes such as CVD, PVD, PECVD, ALD, high-density-plasma CVD (HDP-CVD), sputtering, spin-coating, or any combination thereof.

Next, the insulating film 1478 is patterned using lithography and wet/dry etching to form a hole or trench for the I/O pad 1480, exposing the TSV 1482 of the NAND chip 740 for electrical contact in the subsequent processes. A conductive material is then disposed on the NAND substrate 902 and filled the hole and trench for the I/O pad 1480. The conductive material for the I/O pad 1490 can include copper (Cu), tin (Sn), nickel (Ni), gold (Au), silver (Ag), titanium (Ti), aluminum (Al), TiN, TaN, Al, or any combination thereof. The conductive material for the I/O pad 1480 can be disposed by one or more thin film deposition processes such as chemical vapor deposition (CVD), plasma-enhanced CVD (PECVD), physical vapor deposition (PVD), electroplating, electroless plating, sputtering, evaporation, or any combination thereof. The excess conductive materials outside the hole/trench of the I/O pad can be removed by a planarization process (e.g., RIE etch-back and CMP). In some embodiments, the I/O pad 1480 is coplanar with the insulating film 1478. In some embodiments, the I/O pad 1480 can be extruded or recessed from the insulating film 1478.

In some embodiments, similar insulating film, I/O pads and TSVs can also be formed on the CPU substrate 202. In this example, the CPU chip 101 can include one or more substrate contacts as well.

In some embodiments, one or more functional chips (e.g., SRAM, DRAM, GPU, etc.) can be further bonded with the CPU chip 101 of the 3D IC device 1400 using similar techniques. To prepare the CPU chip 101 of the second 3D IC device for another bonding process, the CPU substrate 202 can be thinned, followed by TSV, bonding layer and interconnect VIA formation on the bottom of the CPU substrate. As such, through hybrid bonding, multiple functional chips can be stacked on top of each other, forming electrical connections with shorter distance, less latency and higher bandwidth.

Accordingly, various embodiments of three-dimensional devices with integrated circuits and methods of making the same are described in the present disclosure. By integrating functional chips in a vertical stack, the distance of electrical connection between the functional chips can be greatly reduced. Therefore, the 3D IC devices can achieve smaller size, higher density, faster speed and higher bandwidth compared with other two-dimensional ICs.

In some embodiments, a method for forming a three-dimensional semiconductor device includes forming a microprocessor chip, which includes forming at least one microprocessor device on a first substrate and forming a first interconnect layer on the at least one microprocessor device, the first interconnect layer having at least one first interconnect structure. The method also includes forming a memory chip, which includes forming at least one memory cell on a second substrate and forming a second interconnect layer on the at least one memory cell, the second interconnect layer having at least one second interconnect structure. The method further includes bonding the first interconnect layer of the microprocessor chip with the second interconnect layer of the memory chip, such that the at least one microprocessor device of the microprocessor chip is electrically connected with the at least one memory cell of the memory chip through the at least one first interconnect structure or the at least one second interconnect structure.

In some embodiments, a method for forming a three-dimensional semiconductor device includes forming a first memory chip, which includes forming at least one first memory cell on a first substrate and forming a first interconnect layer on the at least one first memory cell, the first interconnect layer having at least one first interconnect structure. The method also includes forming a second memory chip, which includes forming at least one second memory cell on a second substrate and forming a second interconnect layer on the at least one second memory cell, the second interconnect layer having at least one second interconnect structure. The method further includes bonding the first interconnect layer of the first memory chip with the second interconnect layer of the second memory chip, such that the at least one first memory cell of the first memory chip is electrically connected with the at least one second memory cell of the second memory chip through the at least one first interconnect structure or the at least one second interconnect structure. The method also includes forming a microprocessor chip, which includes forming at least one microprocessor device on a third substrate and forming a third interconnect layer on the at least one microprocessor device, the third interconnect layer having at least one third interconnect structure. The method further includes bonding the third interconnect layer of the microprocessor chip with the first substrate of the first memory chip, such that the at least one microprocessor device of the microprocessor chip is electrically connected with the at least one first memory cell of the first memory chip through the at least one first interconnect structure or the at least one third interconnect structure.

In some embodiments, a three-dimensional (3D) semiconductor device includes a microprocessor chip, having at least one microprocessor device on a first substrate and a first interconnect layer disposed on the at least one microprocessor device, the first interconnect layer including at least one first interconnect structure. The 3D semiconductor device also includes a memory chip, having at least one memory cell on a second substrate and a second interconnect layer disposed on the at least one memory cell, the second interconnect layer including at least one second interconnect structure. In the 3D semiconductor device, the first interconnect layer of the microprocessor chip is bonded with the second interconnect layer of the memory chip, and the at least one microprocessor device is electrically connected with the at least one memory cell through the at least one first interconnect structure or the at least one second interconnect structure.

In some embodiments, a three-dimensional (3D) semiconductor device includes a microprocessor chip, having at least one microprocessor device on a first substrate and a first interconnect layer disposed on the at least one microprocessor device, the first interconnect layer including at least one first interconnect structure. The 3D semiconductor device also includes a first memory chip, having at least one first memory cell on a second substrate and a second interconnect layer disposed on the at least one first memory cell, the second interconnect layer including at least one second interconnect structure. The 3D semiconductor device further includes a second memory chip, having at least one second memory cell on a third substrate and a third interconnect layer disposed on the at least one second memory cell, the third interconnect layer including at least one third interconnect structure. In the 3D semiconductor device, the first interconnect layer of the microprocessor chip is bonded with the second substrate of the first memory chip, and the at least one microprocessor device of the microprocessor chip is electrically connected with the at least one first memory cell of the first memory chip through the at least one first interconnect structure or the at least one second interconnect structure. In the 3D semiconductor device, the third interconnect layer of the second memory chip is also bonded with the second interconnect layer of the first memory chip, and the at least one microprocessor device of the microprocessor chip is electrically connected with the at least one second memory cell of the second memory chip through the at least one first interconnect structure, the at least second interconnect structure, or the at least one third interconnect structure.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional semiconductor device, comprising:
   forming a microprocessor chip, comprising:
      forming at least one microprocessor device on a first substrate; and
      forming a first interconnect layer on the at least one microprocessor device, the first interconnect layer comprising at least one first interconnect structure;
   forming a memory chip, comprising:
      forming at least one memory cell on a second substrate; and
      forming a second interconnect layer on the at least one memory cell, the second interconnect layer comprising at least one second interconnect structure; and
   bonding the first interconnect layer of the microprocessor chip with the second interconnect layer of the memory chip, such that the at least one microprocessor device of the microprocessor chip is electrically connected with the at least one memory cell of the memory chip through the at least one first interconnect structure or the at least one second interconnect structure.

2. The method of claim 1, wherein the forming of the microprocessor chip comprises forming a digital signal processor, a microcontroller, or a central computing unit for a computer or a mobile device.

3. The method of claim 1, wherein the forming of the memory chip comprises forming a static random-access memory, a dynamic random-access memory or a flash memory.

4. The method of claim 1, wherein the bonding of the first interconnect layer of the microprocessor chip with the second interconnect layer of the memory chip comprises dielectric-to-dielectric bonding and metal-to-metal bonding at a bonding interface.

5. A method for forming a three-dimensional semiconductor device, comprising:
   forming a first memory chip, comprising:
      forming at least one first memory cell on a first substrate; and
      forming a first interconnect layer on the at least one first memory cell, the first interconnect layer comprising at least one first interconnect structure;
   forming a second memory chip, comprising:
      forming at least one second memory cell on a second substrate; and
      forming a second interconnect layer on the at least one second memory cell, the second interconnect layer comprising at least one second interconnect structure;
   bonding the first interconnect layer of the first memory chip with the second interconnect layer of the second memory chip, such that the at least one first memory cell of the first memory chip is electrically connected with the at least one second memory cell of the second memory chip through the at least one first interconnect structure or the at least one second interconnect structure;
   forming a microprocessor chip, comprising:
      forming at least one microprocessor device on a third substrate; and
      forming a third interconnect layer on the at least one microprocessor device, the third interconnect layer comprising at least one third interconnect structure; and
   bonding the third interconnect layer of the microprocessor chip with the first substrate of the first memory chip, such that the at least one microprocessor device of the microprocessor chip is electrically connected with the at least one first memory cell of the first memory chip through the at least one first interconnect structure or the at least one third interconnect structure.

6. The method of claim 5, wherein the bonding of the first interconnect layer of the first memory chip with the second interconnect layer of the second memory chip comprises dielectric-to-dielectric bonding and metal-to-metal bonding at a bonding interface.

7. The method of claim 5, wherein the bonding of the third interconnect layer of the microprocessor chip with the first substrate of the first memory chip comprises dielectric-to-dielectric bonding and metal-to-metal bonding at a bonding interface.

8. The method of claim 5, further comprising:
   forming at least one vertical interconnect structure, extending through the first substrate of the first memory chip, wherein the at least one vertical interconnect structure provides electrical connection to the at least one first interconnect structure.

9. The method of claim 5, further comprising:
   forming at least one vertical interconnect structure, extending through the second substrate of the second memory chip, wherein the at least one vertical interconnect structure provides electrical connection to the at least one second interconnect structure.

10. The method of claim 5, further comprising:
forming at least one vertical interconnect structure, extending through the third substrate of the microprocessor chip, wherein the at least one vertical interconnect structure provides electrical connection to the at least one third interconnect structure.

11. The method of claim 5, wherein the forming of the microprocessor chip comprises forming a digital signal processor, a microcontroller, or a central computing unit for a computer or a mobile device.

12. The method of claim 5, wherein the forming of the first memory chip comprises forming a static random-access memory or a dynamic random-access memory.

13. The method of claim 5, wherein the forming of the second memory chip comprises forming a flash memory.

14. A three-dimensional semiconductor device, comprising:
a microprocessor chip, comprising:
at least one microprocessor device on a first substrate; and
a first interconnect layer disposed on the at least one microprocessor device, the first interconnect layer comprising at least one first interconnect structure;
a first memory chip, comprising:
at least one first memory cell on a second substrate; and
a second interconnect layer disposed on the at least one first memory cell, the second interconnect layer comprising at least one second interconnect structure; and
a second memory chip, comprising:
at least one second memory cell on a third substrate; and
a third interconnect layer disposed on the at least one second memory cell, the third interconnect layer comprising at least one third interconnect structure,
wherein the first interconnect layer of the microprocessor chip is bonded with the second substrate of the first memory chip, and the at least one microprocessor device of the microprocessor chip is electrically connected with the at least one first memory cell of the first memory chip through the at least one first interconnect structure or the at least one second interconnect structure; and
wherein the third interconnect layer of the second memory chip is bonded with the second interconnect layer of the first memory chip, and the at least one microprocessor device of the microprocessor chip is electrically connected with the at least one second memory cell of the second memory chip through the at least one first interconnect structure, the at least second interconnect structure, or the at least one third interconnect structure.

15. The three-dimensional semiconductor device of claim 14, wherein the at least one first memory cell of the first memory chip is electrically connected with the at least one second memory cell of the second memory chip through the at least one third interconnect structure or the at least one second interconnect structure.

16. The three-dimensional semiconductor device of claim 14, further comprising:
a bonding interface between the third interconnect layer of the second memory chip and the second interconnect layer of the first memory chip, wherein the bonding interface comprises dielectric-to-dielectric bonding and metal-to-metal bonding.

17. The three-dimensional semiconductor device of claim 14, further comprising:
a bonding interface between the first interconnect layer of the microprocessor chip and the second substrate of the first memory chip, wherein the bonding interface comprises dielectric-to-dielectric bonding and metal-to-metal bonding.

18. The three-dimensional semiconductor device of claim 14, wherein the microprocessor chip comprises a digital signal processor, a microcontroller, or a central computing unit for a computer or a mobile device.

19. The three-dimensional semiconductor device of claim 14, wherein the first memory chip comprises a static random-access memory or a dynamic random-access memory.

20. The three-dimensional semiconductor device of claim 14, wherein the second memory chip comprises a flash memory.

* * * * *